US009053805B2

(12) United States Patent
Maeda

(10) Patent No.: US 9,053,805 B2
(45) Date of Patent: Jun. 9, 2015

(54) SEMICONDUCTOR MEMORY DEVICE

(71) Applicant: KABUSHIKI KAISHA TOSHIBA, Tokyo (JP)

(72) Inventor: Takashi Maeda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/014,234

(22) Filed: Aug. 29, 2013

(65) Prior Publication Data
US 2014/0269094 A1 Sep. 18, 2014

(30) Foreign Application Priority Data

Mar. 15, 2013 (JP) ................................. 2013-053683

(51) Int. Cl.
G11C 7/06 (2006.01)
G11C 16/26 (2006.01)
(52) U.S. Cl.
CPC ................ *G11C 16/26* (2013.01); *G11C 7/067* (2013.01)
(58) Field of Classification Search
CPC ....................................................... G11C 16/26
USPC ................................................... 365/185.21
See application file for complete search history.

(56) References Cited

U.S. PATENT DOCUMENTS

| 6,798,697 | B2 * | 9/2004 | Hosono et al. | 365/185.12 |
|---|---|---|---|---|
| 7,023,736 | B2 * | 4/2006 | Cernea et al. | 365/185.21 |
| 7,974,134 | B2 * | 7/2011 | Zhang et al. | 365/185.21 |
| 8,116,139 | B2 | 2/2012 | Kuo et al. | |
| 8,503,244 | B2 * | 8/2013 | Ito et al. | 365/185.18 |
| 2006/0146607 | A1 * | 7/2006 | Hosono et al. | 365/185.12 |
| 2006/0158947 | A1 * | 7/2006 | Chan et al. | 365/210 |
| 2008/0117701 | A1 * | 5/2008 | Chan et al. | 365/205 |
| 2011/0116320 | A1 * | 5/2011 | Zhang et al. | 365/185.21 |
| 2011/0235420 | A1 * | 9/2011 | Sharon et al. | 365/185.17 |
| 2012/0320677 | A1 * | 12/2012 | Maejima et al. | 365/185.11 |
| 2013/0100744 | A1 * | 4/2013 | She et al. | 365/185.21 |

* cited by examiner

*Primary Examiner* — Son Mai
(74) *Attorney, Agent, or Firm* — Patterson & Sheridan, LLP

(57) ABSTRACT

A semiconductor memory device includes a plurality of memory cells, a plurality of bit lines, each of which is electrically connected to a string of the memory cells, and a sense module provided for each of the bit lines. Each sense module includes a sense transistor that is configured to turn on and off to indicate whether or not data is stored in a memory cell that is targeted by a reading operation, the sense transistor having a threshold voltage level and a gate that is connected to a sense node, the sense node being connected to a discharge line through a series of transistors including the sense transistor so that prior to a sensing operation the sense node can be discharged to a level that is set in accordance with a threshold voltage thereof.

18 Claims, 29 Drawing Sheets

| | HLL | BLQ | STB | CLK | LSA | SEN |
|---|---|---|---|---|---|---|
| Initial | VSS | VSS | VSS | VSS | VSS | VSS |
| SEN precharge | VH | VSS | VSS | VSS | VSS | VDD |
| SEN discharge | VSS | VH | VH | VSS | VLSA | VLSA+Vthn |
| BEFORE SENSING BL | VSS | VSS | VSS | VSS | VSS | VLSA+Vthn |

FIG. 9
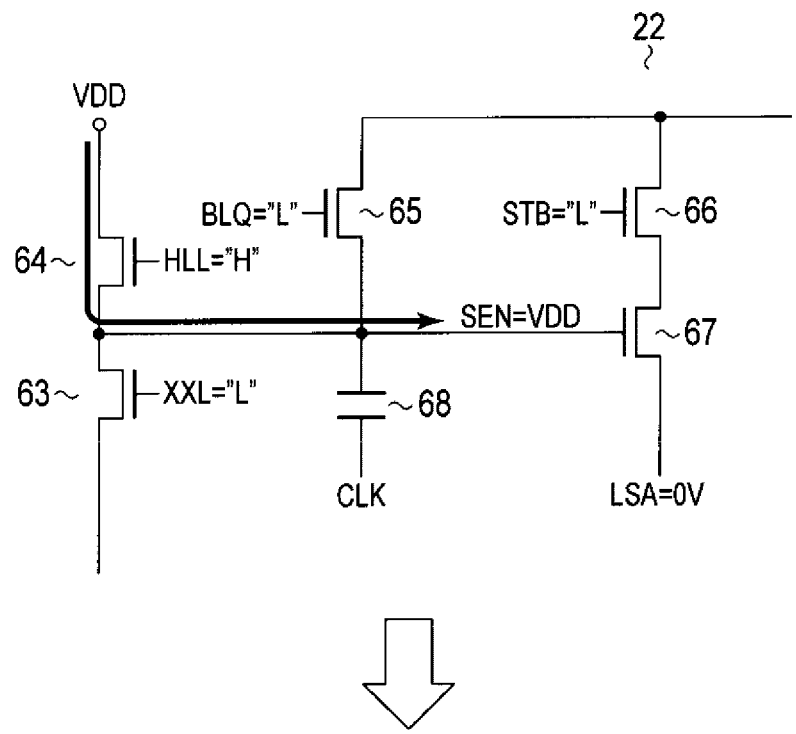
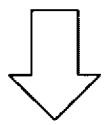
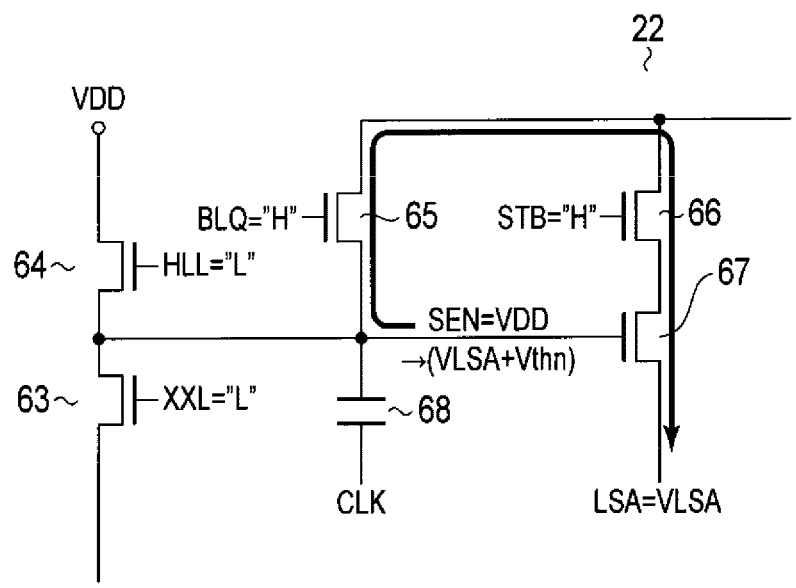

SEMICONDUCTOR MEMORY DEVICE

CROSS-REFERENCE TO RELATED APPLICATION

This application is based upon and claims the benefit of priority from Japanese Patent Application No. 2013-053683, filed Mar. 15, 2013, the entire contents of which are incorporated herein by reference.

FIELD

Embodiments described herein relate generally to a semiconductor memory device.

BACKGROUND

A NAND type flash memory in which memory cells are arranged in a three-dimensional manner is known in the art.

DESCRIPTION OF THE DRAWINGS

FIG. 9 is a circuit diagram of the sense module according to the first embodiment.

DETAILED DESCRIPTION

Figure 1:
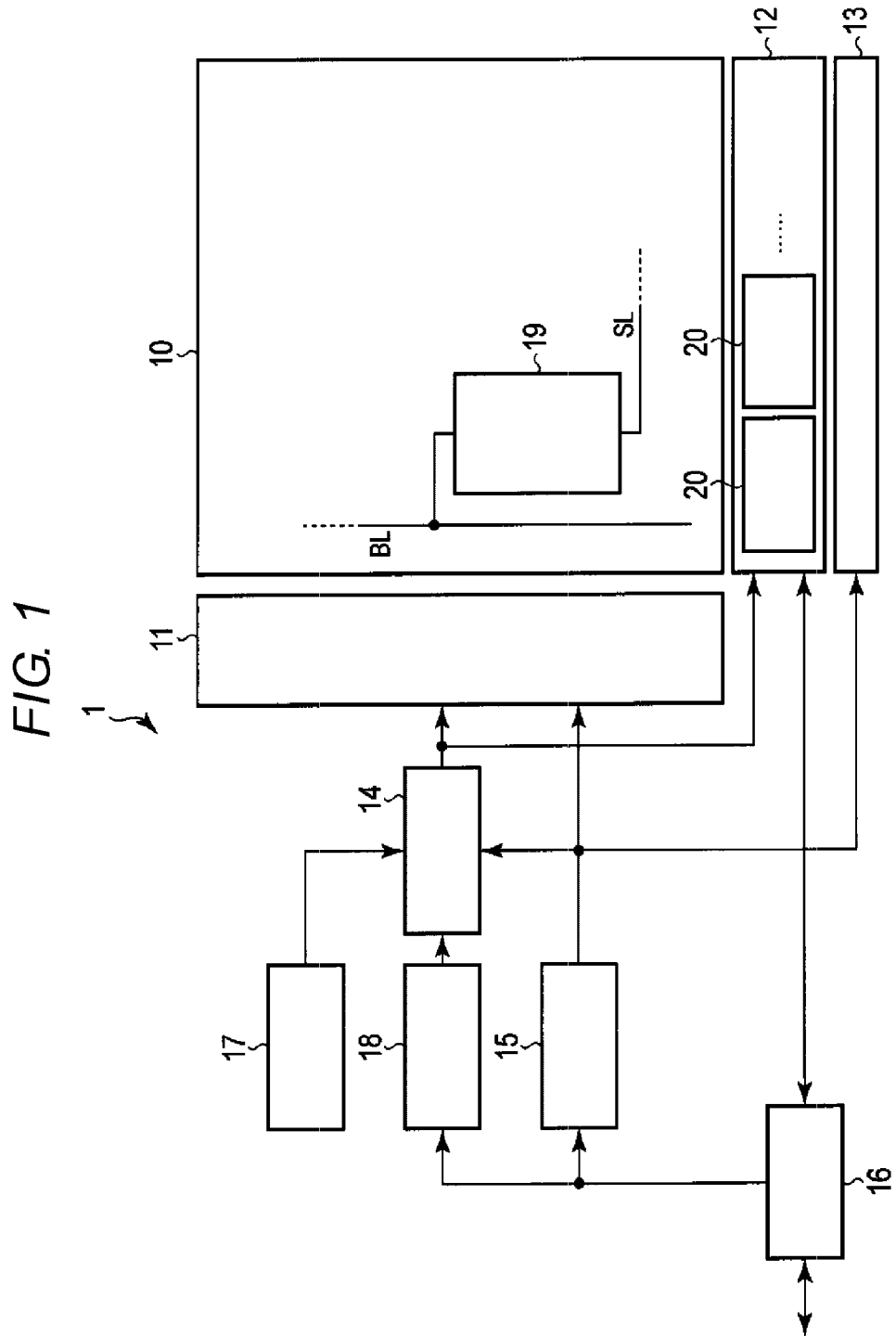
FIG. 1 is a block diagram a semiconductor memory device according to a first embodiment.

Embodiments provide a semiconductor memory device capable of improving operation reliability.

In general, a semiconductor memory device according to an embodiment includes a plurality of memory cells, a plurality of bit lines, each of which is electrically connected to a string of the memory cells, and a sense module provided for each of the bit lines. Each sense module includes a sense transistor that is configured to turn on and off to indicate whether or not data is stored in a memory cell that is targeted by a reading operation, the sense transistor having a threshold voltage level and a gate that is connected to a sense node, the sense node being connected to a discharge line through a series of transistors including the sense transistor so that prior to a sensing operation the sense node can be discharged to a level that is set in accordance with a threshold voltage thereof.

Hereinafter, embodiments will be described with reference to the drawings. In the following description, a common part is given a common reference numeral throughout the overall drawings.

1. First Embodiment

A semiconductor memory device according to the first embodiment will be described. Hereinafter, a three-dimensional stacked NAND type flash memory in which memory cells are stacked on a semiconductor substrate will be described as an example of the semiconductor memory device.

1.1 Configuration of Semiconductor Memory Device

First, a configuration of the semiconductor memory device according to the present embodiment will be described.

1.1.1 Overall Configuration of Semiconductor Memory Device

FIG. 1 is a block diagram of a NAND type flash memory according to the present embodiment. As shown in FIG. 1, the NAND type flash memory 1 includes a memory cell array 10, a row decoder 11, a sense circuit 12, a column decoder 13, a core driver 14, a register 15, an input and output circuit 16, a voltage generation circuit 17, and a control circuit 18.

The memory cell array 10 includes a plurality of NAND strings 19 in which nonvolatile memory cells are connected in series to each other. A gate of the memory cell of the NAND string 19 is connected to a word line (not shown). In addition, a bit line BL is connected to a drain of a memory cell on one end side of the NAND string 19, and a source line SL is connected to a source of a memory cell on the other end side thereof.

The row decoder 11 selects a row direction of the memory cell array 10. In other words, when data is written, read, and erased, any one word line is selected, and necessary voltages are applied to the selected word line and non-selected word lines.

The sense circuit 12 includes sense modules 20 provided so as to correspond to the bit lines BL. The sense module 20 senses and amplifies data which is read to the bit line BL when data is read. In addition, when data is written, data to be written is transmitted to the bit line BL.

The column decoder 13 selects a column direction of the memory cell array 10. In other words, when read data and data to be written are transmitted, any one sense module 20 is selected.

The voltage generation circuit 17 generates voltages necessary to write, read and erase data, for example, in response to a command from the control circuit 18, and supplies the voltages to the core driver 14.

The core driver 14 supplies necessary voltages among the voltages supplied from the voltage generation circuit 17, for example, in response to a command from the control circuit 18, to the row decoder 11 and the sense circuit 12. In addition, the voltages supplied from the core driver 14 are transmitted to the word line by the row decoder 11 and are applied to the bit line by the sense circuit 12.

The input and output circuit 16 controls inputting and outputting of signals to and from a controller or a host apparatus which accesses to the NAND type flash memory 1.

The register 15 holds a command or an address received from the controller or the host apparatus. In addition, the register 15 transmits, for example, a row address to the row decoder 11 and the core driver 14, and transmits a column address to the column decoder 13.

The control circuit 18 controls an operation of the overall NAND type flash memory 1 in response to the command received from the host apparatus. In the following description, various control signals are generated, for example, by the control circuit 18.

1.1.2 Memory Cell Array 10

Figure 2:
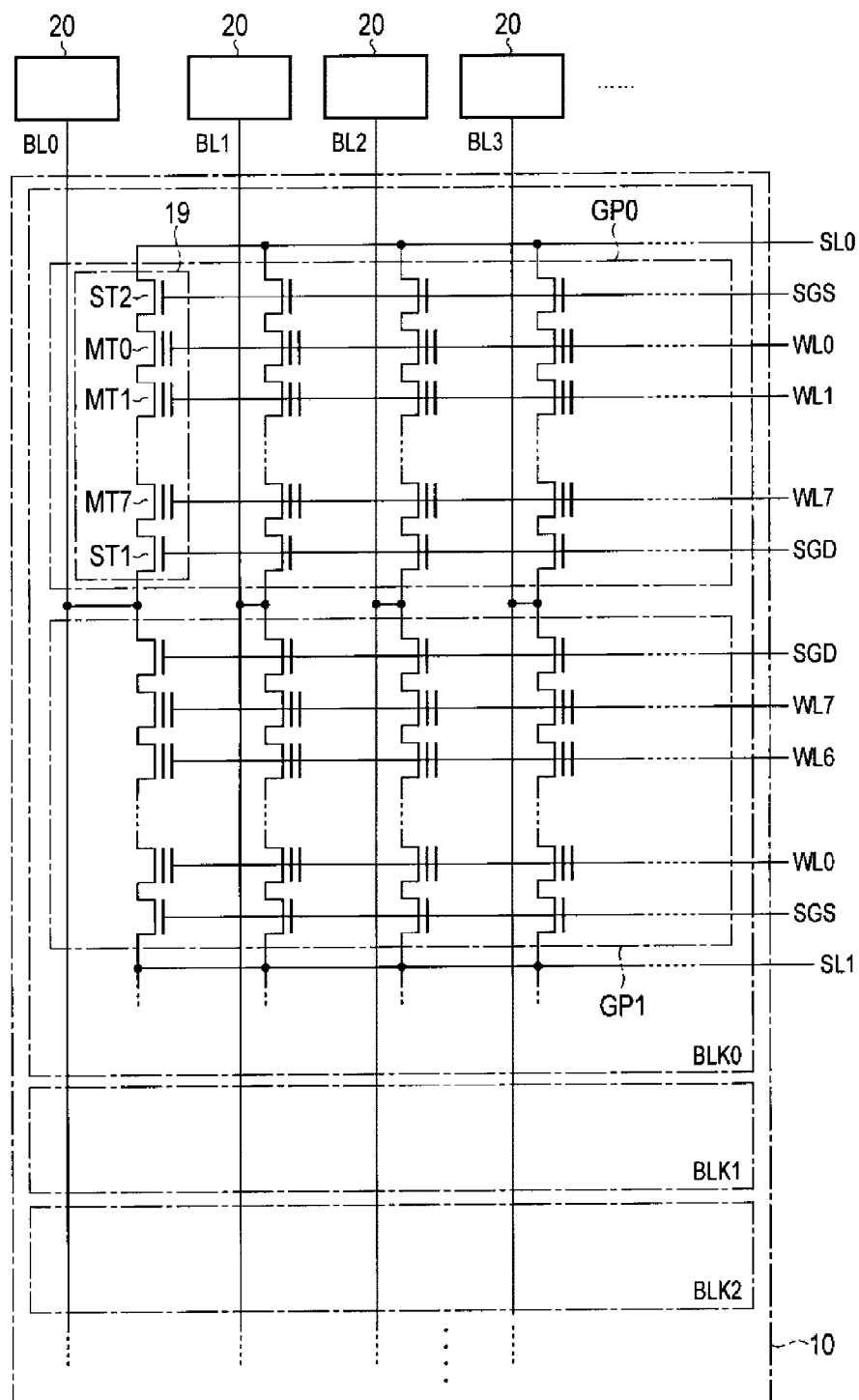
FIG. 2 is a circuit diagram of a memory cell array according to the first embodiment.

Next, a specific configuration of the memory cell array 10 will be described. FIG. 2 is a circuit diagram of the memory cell array 10.

As shown in FIG. 2, the memory cell array 10 includes a plurality of (for example, N) blocks BLK (BLK0, BLK1, BLK2, . . . ) which are groups of nonvolatile memory cells. Data in the same block BLK is collectively erased. Each of the blocks BLK includes a plurality of (for example, M) memory groups GP (GP0, GP1, GP2, . . . ) which are groups of the NAND string 19 in which the memory cells are connected in series to each other. Any number of blocks in the memory cell array 10 and any number of memory groups in the block may be used.

Each of the NAND strings 19 includes, for example, eight memory cell transistors MT (MT0 to MT7) and selection transistors ST1 and ST2. The memory cell transistor MT is provided with a layered gate including a control gate and a charge storage layer, and holds data in a nonvolatile manner. In addition, the number of memory cell transistors MT is not limited to eight, and may be 16, 32, 64, 128, or the like, that is, the number thereof is not limited. The memory cell transistor MT is disposed such that a current path is connected in series between the selection transistors ST1 and ST2. A current path of the memory cell transistor MT7 on one end side of this serial connection is connected to one end of a current path of the selection transistor ST1, and a current path of the memory cell transistor MT0 on the other end side thereof is connected to one end of a current path of the selection transistor ST2.

The gates of the selection transistors ST1 of the memory groups GP0 to GP(M−1) are respectively connected in common to select gate lines SGD0 to SGD(M−1), and the gates of the selection transistors ST2 are respectively connected in common to select gate lines SGS0 to SGS (M−1). In contrast, the control gates of the memory cell transistors MT0 to MT7 of the same block BLK0 are respectively connected in common to the word lines WL0 to WL7, and control gates of back gate transistors BT are connected in common to back-gate lines BG (in the blocks BLK0 to BLK(N−1), respectively BG0 to BG(N−1)).

In other words, the word lines WL0 to WL7 and the back-gate line BG are connected in common between a plurality of memory groups GP of the same block BLK0, whereas the select gate lines SGD and SGS are independent for each memory group GP even in the same block BLK0.

In addition, among the NAND strings 19 which are disposed in a matrix in the memory cell array 10, the other ends of the current paths of the selection transistors ST1 of the NAND strings 19 of the same row are connected in common to any one bit line BL. In other words, the bit line BL is connected in common to the NAND strings 19 between a plurality of blocks BLK. In addition, the other ends of the current paths of the selection transistors ST2 are connected to any one source line SL. The source line SL is connected in common to the NAND strings 19, for example, between a plurality of memory groups GP.

As described above, data of the memory cell transistor MT in the same block BLK is collectively erased. In contrast, reading and writing of data are collectively performed on a plurality of memory cell transistors MT which are connected in common to any one word line WL in any one memory group GP of any one block BLK. This unit is referred to as a "page".

A configuration of the memory cell array 10 is disclosed in U.S. patent application Ser. No. 12/407,403, filed on Mar. 19, 2009, entitled "three-dimensional stacked nonvolatile semiconductor memory". In addition, a configuration thereof is disclosed in U.S. patent application Ser. No. 12/406,524, filed on Mar. 18, 2009, entitled "three-dimensional stacked nonvolatile semiconductor memory", U.S. patent application Ser. No. 12/679,991, filed on Mar. 25, 2010, entitled "nonvolatile semiconductor memory device and manufacturing method thereof", and U.S. patent application Ser. No. 12/532,030, filed on Mar. 23, 2009, entitled "semiconductor memory and manufacturing method thereof". The entire contents of the above-mentioned patent applications are incorporated by reference herein.

1.1.3 Sense Circuit 12

Figure 3:
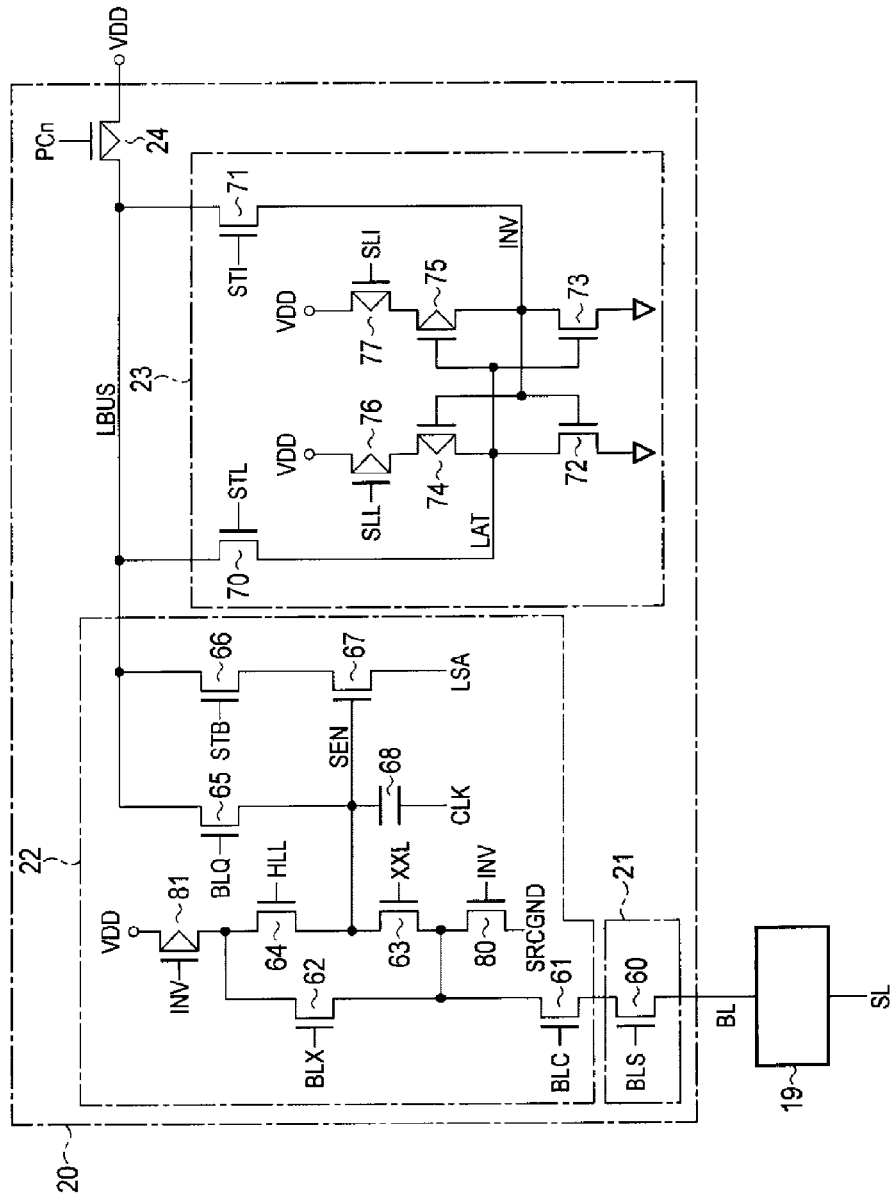
FIG. 3 is a circuit diagram of a sense module according to the first embodiment.

Next, the sense circuit 12 will be described. As described with reference to FIG. 1, the sense circuit 12 includes a plurality of sense modules 20 provided so as to correspond to the bit lines BL. Each sense module 20 is formed on a semiconductor substrate 40 and is provided directly under the memory cell array 10 described with reference to FIG. 2. FIG. 3 is a circuit diagram of the sense module 20.

As shown in FIG. 3, the sense module 20 includes a hook-up portion 21, a sense amplifier 22, a data latch 23, and a p-channel MOS transistor 24.

The hook-up portion 21 includes an n-channel MOS transistor 60. The transistor 60 has a gate to which a signal BLS is applied, and a source connected to the bit line BL. The transistor 60 is used to connect and disconnect the sense module 20 to and from the bit line BL.

The sense amplifier 22 precharges a corresponding bit line BL and senses and amplifies a current flowing through the bit line BL when data is read. The sense amplifier 22 includes n-channel MOS transistors 61 to 67 and 80, a p-channel MOS transistor 81, and a capacitive element 68.

The transistor 61 is used to control a precharge potential of the bit line BL when data is read, and has a source connected to a drain of the transistor 60 and a gate to which a signal BLC is applied. The transistor 81 is used to charge the bit line BL and the capacitive element 68, and has a gate connected to a node INV and a source to which a power supply voltage VDD is applied. The transistor 62 is used to precharge the bit line BL, and has a gate to which a signal BLX is applied, a drain connected to a drain of the transistor 81, and a source connected to the drain of the transistor 61. The transistor 64 is used to charge the capacitive element 68, and has a gate to which a signal HLL is applied, a drain connected to the drain of the transistor 81, and a source connected to a node SEN. The transistor 63 is used to discharge the node SEN when sensing data, and has a gate to which a signal XXL is applied, a drain connected to the node SEN, and a source connected to the drain of the transistor 61. The transistor 80 is used to fix the bit line BL to a specific potential, and has a gate connected to the node INV, a drain connected to the bit line BL, and a source connected to a node SRCGND.

The capacitive element 68 is charged when the bit line BL is precharged, and has one electrode connected to the node SEN and the other electrode to which a signal CLK is applied.

The transistor 65 is used to discharge the node SEN before data is sensed, and has a gate to which a signal BLQ is applied, a source connected to the node SEN, and a drain connected to a node LBUS. The node LBUS is a signal path for connecting the sense amplifier 22 to the data latch 23. The transistor 66 is used to store read data in the data latch 23, and has a gate to which a signal STB is applied, and a drain connected to the node LBUS.

The transistor 67 is used to sense whether a value of read data is "0" or "1", and has a gate connected to the node SEN, a drain connected to the source of the transistor 66, and a source to which a signal LSA is applied. The transistor 67 may be referred to as a "sense transistor" so as to be differentiated from other transistors.

Successively, the data latch 23 will be described. The data latch 23 holds read data which is sensed and amplified by the sense amplifier 22. The data latch 23 includes n-channel MOS transistors 70 to 73, and p-channel MOS transistors 74 to 77.

The transistors 72 and 74 form a first inverter, and have a node LAT which is an output node and a node INV which is an input node. In addition, the transistors 73 and 75 form a second inverter, and have the node INV which is an output node and the node LAT which is an input node. Further, the data latch 23 holds data by using the first and second inverters.

In other words, the transistor 72 has a drain connected to the node LAT, a source connected to the ground, and a gate connected to the node INV. The transistor 73 has a drain connected to the node INV, a source connected to the ground, and a gate connected to the node LAT. The transistor 74 has a drain connected to the node LAT, a source connected to a drain of the transistor 76, and a gate connected to the node INV. The transistor 75 has a drain connected to the node INV, a source connected to a drain of the transistor 77, and a gate connected to the node LAT.

The transistor 76 is used to enable the first inverter, and has a source to which the power supply voltage VDD is applied and a gate to which a signal SLL is applied. The transistor 77 is used to enable the second inverter, and has a source to which the power supply voltage VDD is applied and a gate to which a signal SLI is applied.

The transistors 70 and 71 control inputting and outputting of data to and from the first and second inverters. The transistor 70 has a drain connected to the node LBUS, a source connected to the node LAT, and a gate to which a signal STL is applied. The transistor 71 has a drain connected to the node LBUS, a source connected to the node INV, and a gate to which a signal STI is applied.

Next, the transistor 24 will be described. The transistor 24 is used to charge the node LBUS to the power supply voltage VDD. In other words, the transistor 24 has a source to which the power supply voltage VDD is applied, a drain connected to the node LBUS, and a gate to which a signal PCn is applied.

In the above-described configuration, the various control signals are applied, for example, by the control circuit 18. An operation of the sense module will be described in detail in the following section 1.2.

1.2 Data Reading Operation

Next, a description will be made of a data reading operation in the NAND type flash memory 1 with the above-described configuration.

1.2.1 Voltage Relationship of Memory Cell

Figure 4:
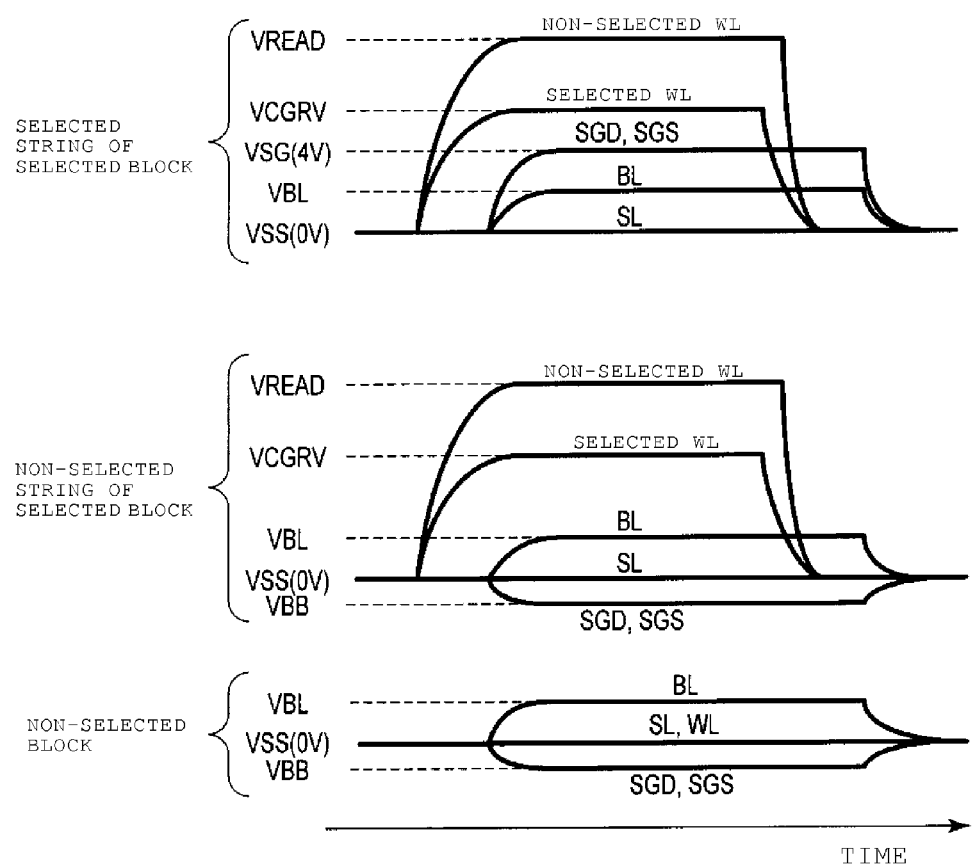
FIG. 4 is a timing chart of various signals in a reading operation according to the first embodiment.

First, with reference to FIG. 4, a description will be made of voltages applied to the memory cells when reading is performed. FIG. 4 is a timing chart illustrating potentials of the respective lines when reading is performed.

As shown in FIG. 4, first, the core driver 14 generates voltages VCGRV, VREAD, VSG and VBB. The voltage VCGRV is a voltage which should be applied to a selected word line and a voltage corresponding to data (threshold level) which is desired to be read. The voltage VREAD is a voltage for turning on the memory cell transistor regardless of held data (VREAD>VCGRV). The voltage VSG is a voltage for turning on the selection transistors ST1 and ST2 (VREAD>VSG). The voltage VBB is a voltage for turning off the selection transistors ST1 and ST2, and is, for example, a negative voltage, 0 V, or the like (VSG>VBB).

The row decoder 11 transmits the voltages VCGRV and VREAD to a word line WL of a selected block (a block that includes a read target page). On the other hand, a word line WL of a non-selected block is made to be electrically floated.

Next, the row decoder 11 transmits a voltage to the select gate lines SGD and SGS. In other words, the row decoder 11 transmits the voltage VSG (for example, 4 V) to the select gate lines SGD and SGS of a selected string (a NAND string including a read target page) of a selected block. Thereby, the selection transistors ST1 and ST2 are turned on. On the other hand, the voltage VBB is transmitted to the select gate lines SGD and SGS of a non-selected string of the selected block and the select gate lines SGD and SGS of a non-selected block. Thereby, the selection transistors ST1 and ST2 are turned off.

In addition, a voltage VSS (a ground potential, for example, 0 V) is applied to the source line SL by a source line driver, and the voltage VBL is applied to the bit line BL by the sense module 20.

In the above-described way, the voltage VCGRV is applied to the control gate of the selected memory cell, and a current path thereof is electrically connected to the bit line BL and the source line SL. If the selected memory cell is turned on, a current flows from the bit line BL to the source line SL. The sense module 20 detects this current so as to perform a reading operation.

1.2.2 Operation of Sense Module

Figures 5, 6:
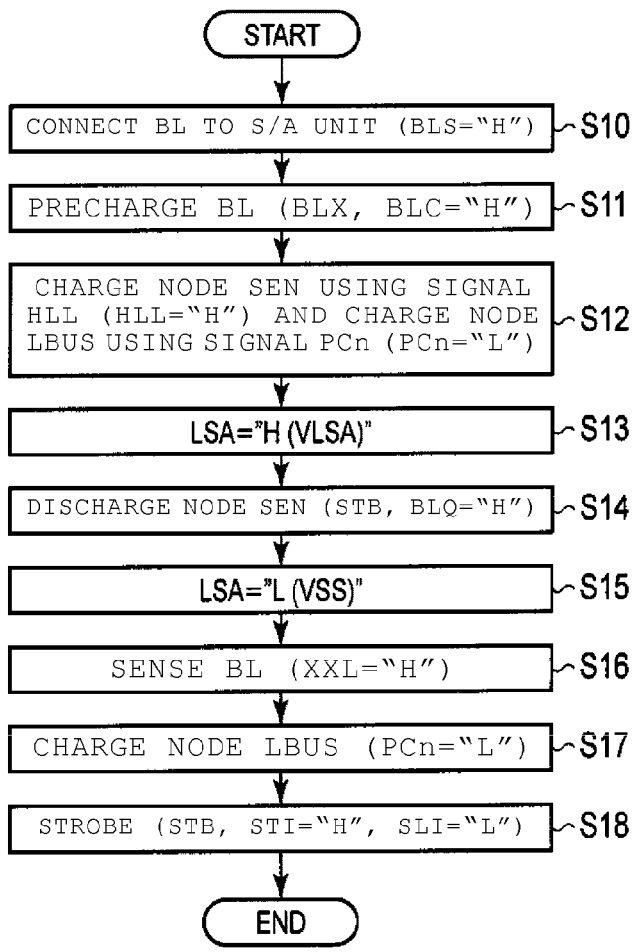
FIG. 5 is a flowchart illustrating a reading operation according to the first embodiment.
FIG. 6 is a diagram illustrating voltages of various signals in the reading operation according to the first embodiment.
Figure 7:
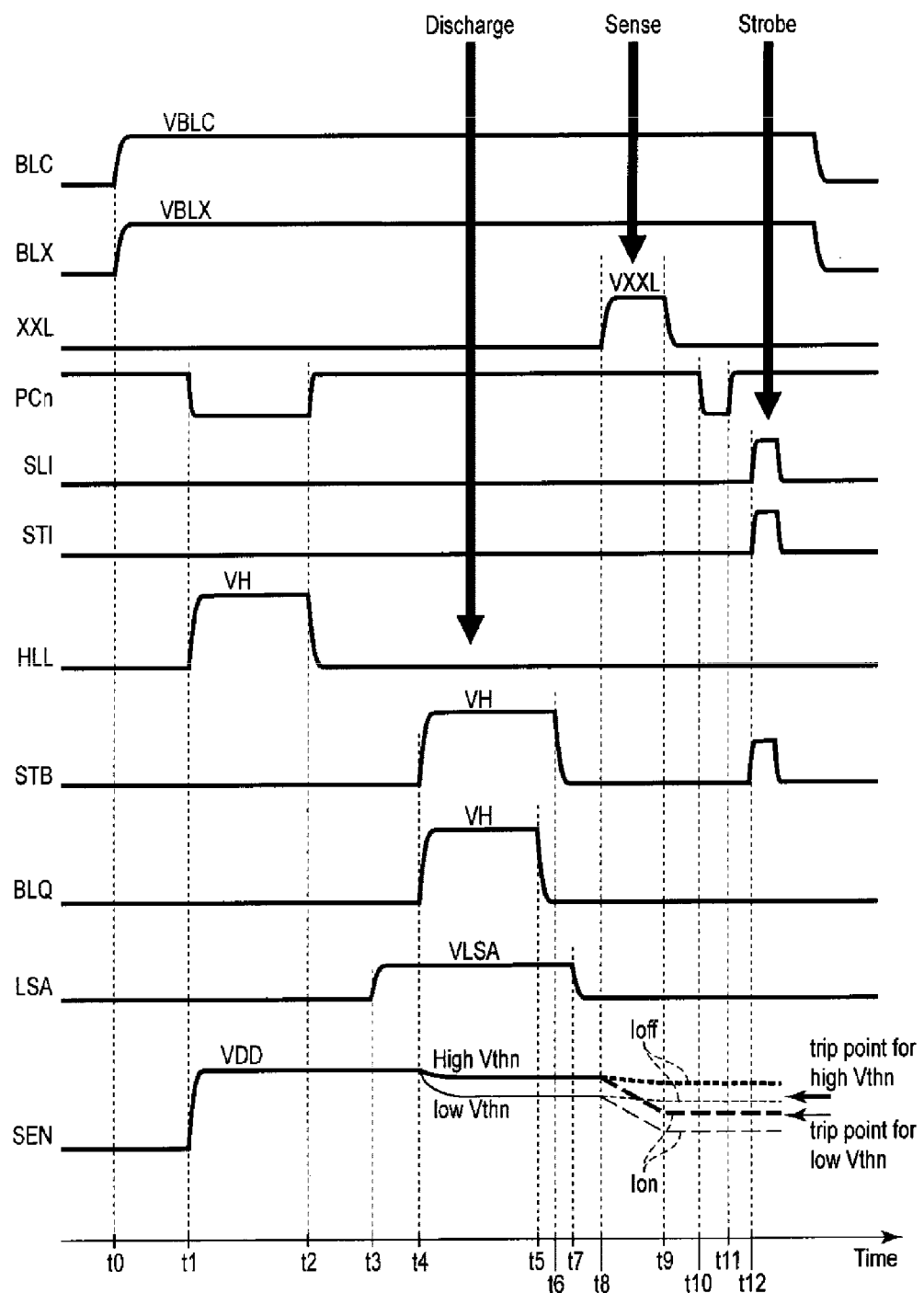
FIG. 7 is a timing chart of various signals in the reading operation according to the first embodiment.

Next, with reference to FIGS. 5 to 7, a detailed description will be made of an operation of the sense module when reading is performed. FIG. 5 is a flowchart illustrating a flow of an operation of the sense module 20, FIG. 6 is a table illustrating a potential of the control signal in each phase, and FIG. 7 is a timing chart illustrating potentials of various control signals and various nodes.

First, the control circuit 18 sets the signal BLS to an "H" level and connects the sense module 20 to a corresponding bit line BL (step S10). In addition, the node INV is reset to have an "L" level.

In addition, the sense module 20 precharges the bit line BL (step S11). In other words, the control circuit 18 sets the signals BLX and BLC to an "H" level (the time point t0). Thereby, the bit line BL is precharged by the voltage VDD via the current path of the transistors 60 to 62 and 81. In addition, the voltage VH in FIGS. 6 and 7 is a voltage at which a transistor can transmit the voltage VDD. Further, the voltage VBLC is a voltage which determines a bit line voltage, and the bit line voltage becomes a voltage VBL which is clamped by the voltage VBLC.

Next, the sense module 20 charges the node SEN (step S12). In other words, the control circuit 18 sets the signal HLL to an "H" level (time point t1). Thereby, the transistor 64 is turned on, and the node SEN is charged to the voltage VDD. The charging of the node SEN is performed until the time point t2. When a potential of the node SEN becomes the voltage VDD, the transistor 67 is turned on. In addition, the sense module 20 charges the node LBUS. In other words, the control circuit 18 sets the signal PCn to an "L" level (the time point t1). Thereby, the transistor 24 is turned on, and thus the node LBUS is charged to the voltage VDD.

After the time point t2, the control circuit 18 sets the signal LSA to an "H" level (step S13, and the time point t3). In other words, the control circuit 18 increases a potential of the signal LSA which is VSS until then to VLSA. The voltage VLSA is a voltage which does not have a temperature characteristic and is generated using, for example, a bandgap reference voltage or the like. A circuit which generates the voltage VLSA will be described in detail in a fourth embodiment.

Subsequently, the sense module 20 discharges the node SEN which is charged up to VDD (step S14). In other words, the control circuit 18 sets the signals STB and BLQ to an "H" level (the voltage VH) (the time point t4). Thereby, the transistors 65 and 66 are turned on, and a potential of the node SEN is discharged to (VLSA+Vthn) via the current path of the transistors 65 to 67. In addition, Vthn is a threshold voltage of the sense transistor 67. The threshold voltage Vthn has a disparity for each transistor, and thus FIG. 7 shows a case (the thick solid line) where the threshold voltage Vthn is large and a case (the thin solid line) where the threshold voltage Vthn is small.

In addition, the control circuit 18 finishes the discharging of the node SEN and sets the signal LSA to an "L" level (step S15). Further, at this time, the control circuit 18 first sets the signal BLQ to an "L" level (the time point t5), then sets the signal STB to an "L" level (the time point t6), and finally sets the signal LSA to an "L" level (the time point t7).

Next, the sense module 20 senses the bit line BL (step S16). In other words, the control circuit 18 sets the signal XXL to an "H" level (the time point t8). Thereby, the transistor 63 is turned on, and the node SEN is electrically connected to the bit line BL. Then, if the selected memory cell is turned on, a current flows from the node SEN to the source line SL, and thus a potential of the node SEN is reduced. On the other hand, if the selected memory cell is turned off, a current does not flow from the node SEN to the source line SL, and a potential of the node SEN is maintained as almost VDD.

Next, the sense module 20 charges the node LBUS (step S17). In other words, the control circuit 18 sets the signal PCn to an "L" level (the time point t10). Thereby, the transistor 24 is turned on, and thus the node LBUS is charged to the voltage VDD by the transistor 24.

Finally, the sense module 20 strobes data (step S18). In other words, the control circuit 18 sets the signal STB to an "H" level, sets the signal SLI to an "L" level, and sets the signal STI to an "H" level (the time point t12). Thereby, the transistors 66, 71 and 77 are turned on. If the sense transistor 67 is turned on (that is, SEN="H"), the node LBUS is discharged to almost VSS, and the node INV stores an "L" level. If the sense transistor 67 is turned off (that is, SEN="L"), a potential of the node LBUS is maintained as VDD, and the node INV stores an "H" level.

1.3 Effects According to Present Embodiment

According to the configuration according to the present embodiment, it is possible to improve operation reliability of the NAND type flash memory 1. This effect will be described below.

In a semiconductor memory device such as a NAND type flash memory, since there are a process disparity, a temperature disparity, a fluctuation in the power supply voltage, a local disparity of a transistor, and the like, a sufficient margin is required to be secured when a circuit is designed in order to perform an appropriate operation.

For example, an On current of a memory cell is reduced, whereas an Off leakage current increases, due to miniaturization of a memory cell or introduction of a new structure of stacking memory cells. For this reason, in a reading operation, a sufficient On/Off ratio cannot be established, and a margin which can be secured is reduced. On the other hand, since a global disparity in the processes or the temperatures or a local disparity in transistor characteristics is not greatly improved, an operation with a small margin is not easy.

In a NAND type flash memory in the related art, a sense module determines whether a cell current which flows when a certain potential is applied to a bit line is larger or smaller than a sense current Isense, and thereby data is read. Specifically, a sense node is charged in advance, electric charge in the sense node is released for a certain time by a cell current. After the discharging finishes, a sense transistor determines whether a voltage of the sense node is larger or smaller than a determination voltage (trip point), and a result thereof is preserved in a data latch.

In this reading method, a voltage of the sense node is determined by the sense transistor, and thus a trip point depends on a threshold value of the sense transistor. In other words, the trip point is directly influenced by a disparity in the threshold value. For this reason, an unnecessary margin corresponding to the threshold value disparity is required to be secured.

The threshold value dependency of a current of the sense transistor is shown in a form of a difference between a sense node voltage and a threshold value such as (Vsen−Vthn) (Vthn is a threshold voltage of the sense transistor). Therefore, if there is a disparity in Vthn, the threshold value disparity can be canceled out by adjusting Vsen according to a value of Vthn. In order to cancel out the threshold value disparity, a method of adjusting a charged voltage of the sense node according to a value of Vthn is considered. However, in the method of adjusting a charged voltage according to a value of Vthn in this way, a charged voltage is generated by a transistor separate from the sense transistor, and thus a global threshold value disparity (a disparity for the overall sense amplifier) in the processes, the temperatures, or the like can be compensated, but a local disparity (a disparity for each transistor) cannot be compensated. Therefore, it cannot be said that this method is sufficient to suppress a disparity in the trip point.

A disparity factor in a sensing operation will be described more in detail. A voltage Vsen(f) of the sense node after being discharged in the sensing operation is a voltage in which electric charge accumulated so as to correspond to a capacitance of the sense node is released by a cell current Icell for a sense time Tsense, starting from a charged voltage Vsen(i), and is given by the following Equation (1).

$$Vsen(f)=Vsen(i)-((Icell \times Tsense)/Csen) \quad (1)$$

In addition, a drain current Ids of the sense transistor is a function of a difference between a potential Vsen(f) of the sense node and a threshold voltage Vthn of the sense transistor, and may be represented in a form of the following Equation (2).

$$Ids(Vsen(f)-Vthn)=Ids(Vsen(i)-Vthn-((Icell \times Tsense)/Csen) \quad (2)$$

Here, Csen indicates a capacitance of the sense node. In this case, Vsen(i) includes a disparity due to reduction in power supply when charging is performed, Vthn includes a threshold value disparity of the sense transistor, Icell includes a disparity in the cell current, Tsense includes a timer disparity or a disparity due to a line delay, and Csen includes a capacitance disparity.

Figure 8:
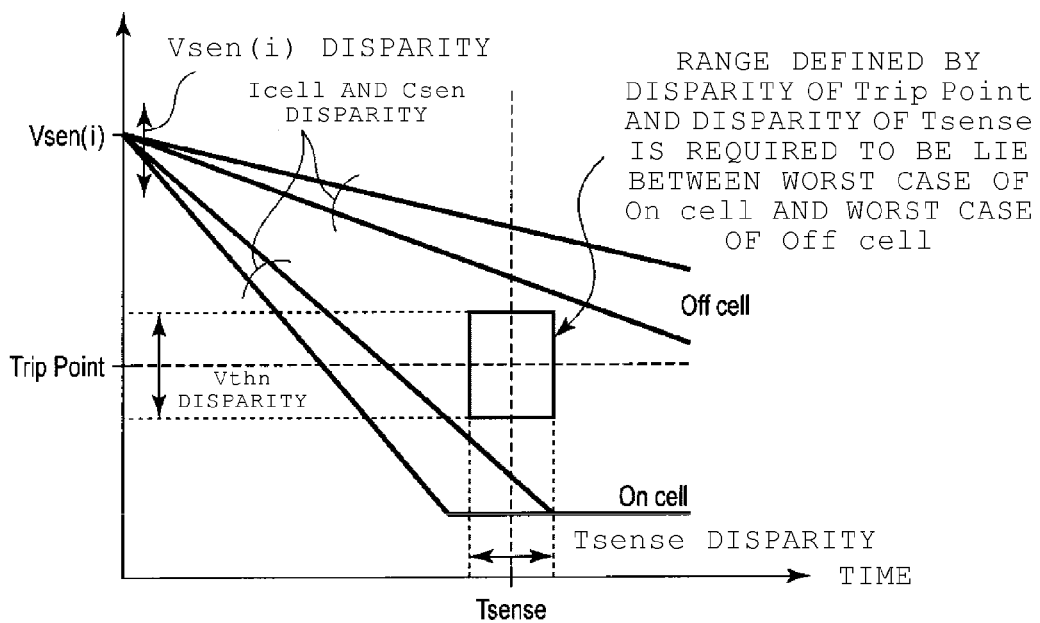
FIG. 8 is a graph illustrating variations in a sense node voltage with time.

Influence which these disparities have on discharging of the sense node will be described with reference to FIG. 8. FIG. 8 shows a time variation of a sense node voltage after the sensing operation starts. In FIG. 8, the upper two graphs indicate a case where the memory cell is turned off, and the lower two graphs indicate a case where the memory cell is turned on.

As shown in FIG. 8, the disparity (a disparity in Vsen(i)) in the charged voltage of the sense node makes a discharge starting voltage vary. The disparities in Icell and Csen make a slope of a voltage variation of the sense node vary. The disparity in Tsense makes timings of starting and finishing sensing vary. The disparity in Vthn makes the trip point vary.

As a result of the various factors varying in this way, the region in the rectangular range in FIG. 8 which is defined by the disparity in the trip point and the disparity in Tsense is a region in which correct reading cannot be performed, and this region is required to lie between a graph of a worst case (a case where Off-leakage is large and Vsen is considerably reduced) of a turned-off cell and a graph of a worst case (a case where an On-current is small and reduction in Vsen is small) of a turned-on cell.

As above, the trip point is directly influenced by a threshold voltage disparity of the sense transistor. If the configuration according to the present embodiment is employed in relation to this fact, influence of the local disparity can be reduced, and thereby reading operation reliability can be improved. This fact will be described with reference to FIG. 9. FIG. 9 is a circuit diagram of a partial region of the sense module 20, and shows a state of initial charging (step S12 of FIG. 5) and a state of discharging (step S14 of FIG. 5) of the sense node SEN described with reference to FIG. 7.

As shown in FIG. 9, first, the signal HLL is set to an "H" level, and thereby the sense node SEN is charged to VDD by the transistor 64. Thereby, the sense transistor 67 is turned on.

Thereafter, the signal LSA is given VLSA. In addition, the signals BLQ and STB are set to an "H" level, and thereby the transistors 65 and 66 are turned on so as to discharge the sense node SEN. At this time, the sense transistor 67 may be regarded as being diode-connected. Therefore, a potential of the sense node SEN is set from VDD to (VLSA+Vthn). In other words, in the above-described Equation (2), Vsen(i)= (VLSA+Vthn). Vthn shown here is a threshold voltage itself of the sense transistor 67. Therefore, the disparity in Vthn in Equation (2) can be completely canceled out by Vsen(i). In addition, the voltage VLSA is constant with respect to a temperature variation, and thus Vsen(i) has the same temperature characteristic as Vthn. Accordingly, the temperature characteristic of Vthn in Equation (2) is also canceled out by Vsen(i).

As described above, after the initial charging of the sense node SEN, the sense node SEN is discharged while using the sense transistor 67 as a diode, and thereby a potential of the sense node SEN is set to a voltage including the Vthn disparity of the sense transistor 67. In addition, thereafter, the sense node SEN is sensed. Thereby, influence of the Vthn disparity of the sense transistor 67 can be reduced.

In addition, the voltage VLSA corresponds to a voltage variation of the sense node SEN of which sensing is in progress. Further, a value of VLSA is determined depending on whether or not (VLSA+Vthn) is appropriate as an initial voltage. Specifically, an upper limit of VLSA is set such that the initial voltage (VLSA+Vthn) does not exceed the charged voltage VDD, that is, so as to satisfy the following Expression (3).

$$(VLSA+Vthn(\max))<VDD \quad (3)$$

Here, Vthn(max) is the maximum value of Vthn.

A lower limit of VLSA is defined under the condition that the voltage amplitude of the sense node SEN is sufficiently obtained in a sensing operation after discharging. Specifically, a sensing time in the sensing operation is defined as in the following Equation (4) by using a threshold current Ith by which a potential of the sense node SEN is discharged from the voltage (VLSA+Vthn) after the initial discharging to a trip point (=Vthn).

$$Tsense=Csen \times (VLSA/Ith) \quad (4)$$

In other words, VLSA corresponds to the voltage amplitude of the node SEN.

A difference between voltages of the node SEN which are respectively discharged by a turned-on cell current Ion and a turned-off cell current Ioff for the sensing time Tsense is (Ion−Ioff)×(Tsense/Csen). In other words, since the voltage amplitude of the node SEN by Ion is (Ion×(Tsense/Csen)), and the voltage amplitude of the node SEN by Ioff is (Ioff× (Tsense/Csen)), the expression may be made using this difference.

If this potential difference is larger than a trip point disparity ΔTP (due to a timing disparity or the like) which cannot be compensated only by the threshold voltage compensation according to the present embodiment and is thus left, sensing can be performed.

In other words, the lower limit of VLSA is determined using the following Expression (5).

$$(Ion-Ioff) \times (VLSA/Ith) > \Delta TP \quad (5)$$

In addition, (Ion/Ioff) is defined based on device characteristics or measurement conditions, Ith is defined based on (Ion/Ioff) (for example, Ith=(Ion+Ioff)/2), and ΔTP is defined based on a circuit or a layout.

In this way, the lower limit of VLSA is defined. However, in practical design, VLSA is desirably set to a value around the upper limit in order to obtain a sufficient sensing margin. In other words, if there is no sufficient potential difference between (VLSA+Vthn) and a lower limit of a voltage of the node SEN after being discharged in the sensing operation, there is no sufficient difference between potentials of the sense node SEN, and, as a result, Ion/Ioff cannot be determined. Therefore, (VLSA+Vthn) is preferably sufficiently larger than the lower limit of a potential of the sense node SEN.

In addition, in order to finish the initial discharging from VDD to (VLSA+Vthn) of the sense node SEN, as shown in FIG. 7, preferably, first, the signal BLQ is set to an "L" level, then, the signal STB is set to an "L" level, and, finally, the signal LSA is set to an "L" level. This is aimed at influence when other signals are switched not being exerted on the sense node SEN by sequentially turning off the transistors from the transistor disposed at the position which is the closest to the node SEN.

In addition, in the present embodiment, the initial discharging operation of the node SEN to (VLSA+Vthn) can be performed at the same time as a bit line precharging operation, and thus a reading operation time can be suppressed from being lengthened. In other words, the precharging of the bit line BL is performed by the signal BLC clamping a bit line voltage. Further, this precharging requires a relatively long time. Therefore, if the initial discharging of the node SEN can finish during a period when the bit line BL is precharged, there is no reduction in the reading speed caused by the initial discharging.

2. Second Embodiment

Next, a semiconductor memory device according to the second embodiment will be described. A difference between the present embodiment and the first embodiment is that the node SEN is charged using the signal BLQ instead of the signal HLL. Hereinafter, only the difference from the first embodiment will be described.

2.1 Data Reading Operation

A data reading operation according to the present embodiment will be described. A configuration of the NAND type flash memory 1 is the same as the configuration in the first embodiment, and thus description thereof will be omitted.

Figure 10:
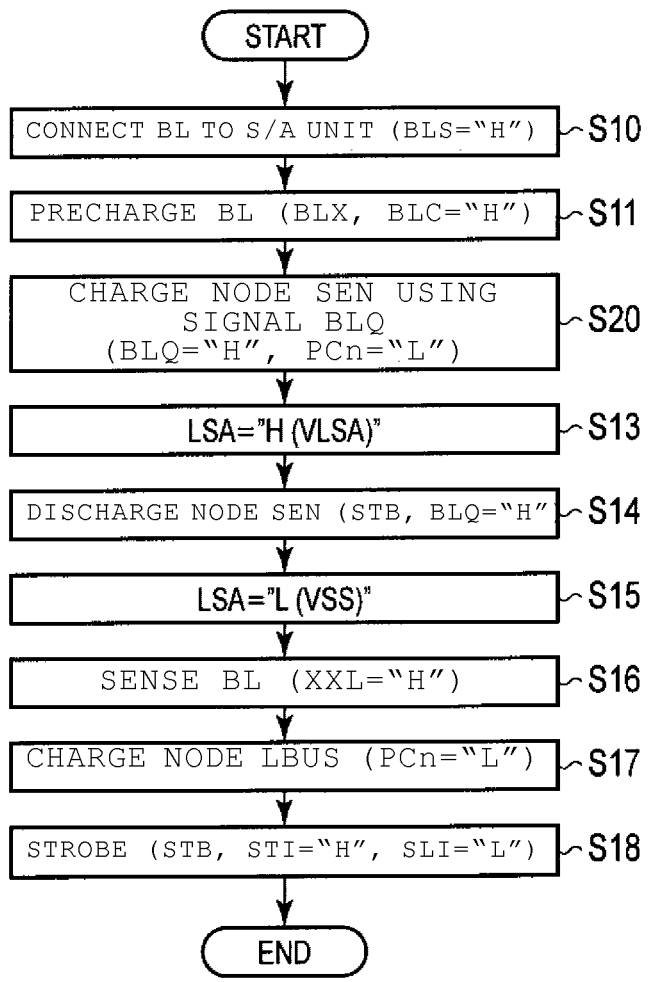
FIG. 10 is a flowchart illustrating a reading operation according to a second embodiment.
Figure 11:
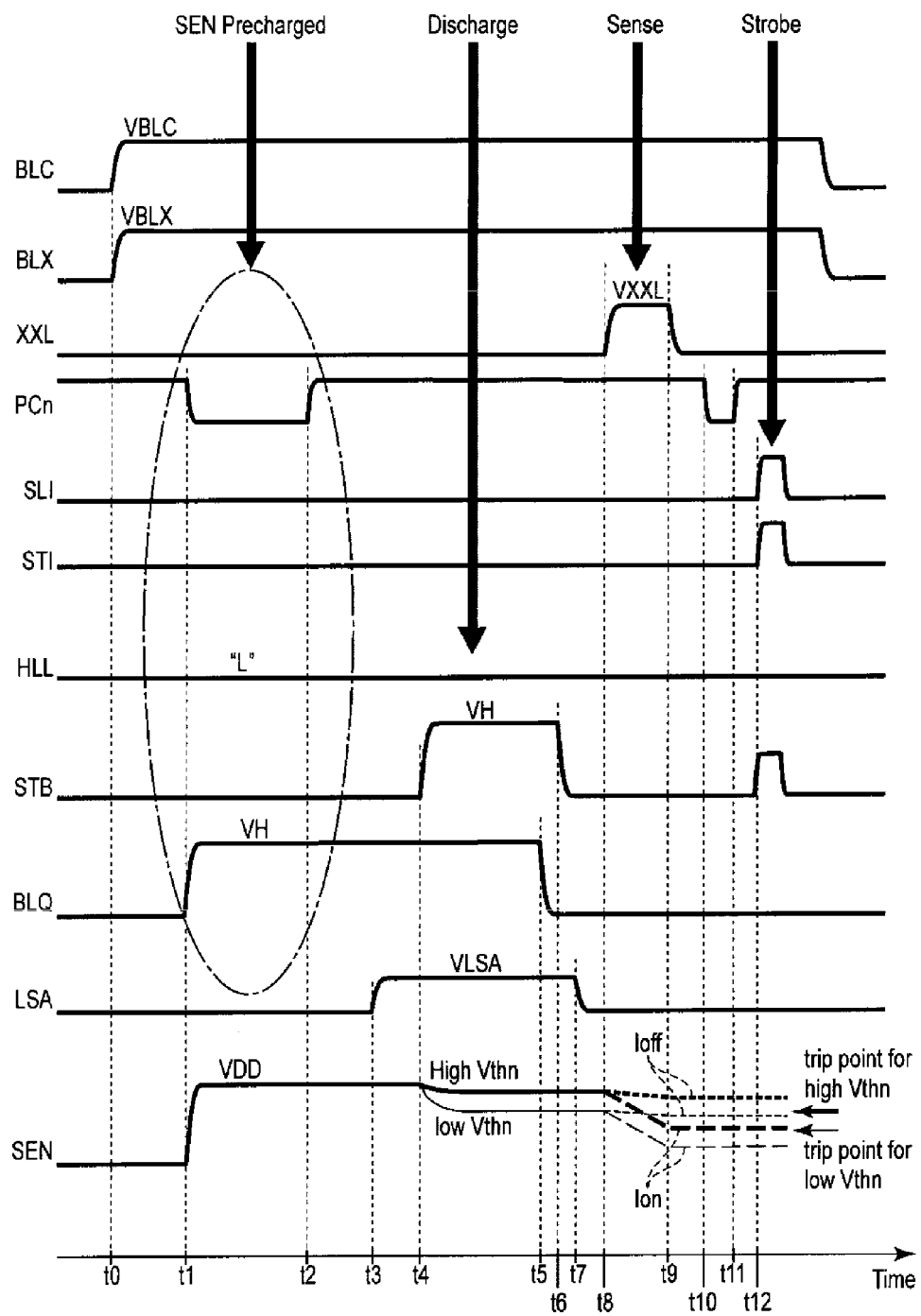
FIG. 11 is a timing chart of various signals in the reading operation according to the second embodiment.

FIG. 10 is a flowchart illustrating a flow of an operation of the sense module 20, and FIG. 11 is a timing chart illustrating potentials of various control signals and various nodes.

As shown in FIGS. 10 and 11, a difference between the present embodiment and the first embodiment described with reference to FIG. 5 is that charging of the node SEN in step S12 is performed using the signal BLQ (step S20). In other words, in step S20, the control circuit 18 sets the signal BLQ to an "H" level (the voltage VH), and sets the signal PCn to an "L" level (VSS) (the time point t1). Then, in the sense module 20 shown in FIG. 3, the transistors 24 and 65 are turned on. Therefore, the node SEN is charged to VDD via the current path of the node LBUS and the transistor 65. Naturally, the signal HLL is in an "L" level during a period of the reading operation.

Thereafter, the processes are performed from step S13. In addition, the signal PCn is turned to an "H" level if the charging of the node SEN is completed, but the signal BLQ is maintained in an "H" level until initial discharging of the node SEN finishes (the time point t5).

2.2 Effects According to Present Embodiment

As described above, the method according to the present embodiment may be employed in charging of the node SEN. In addition, according to this method, power consumption can be further reduced than in the first embodiment. The reason is as follows. In the first embodiment, first, the signal HLL is turned to an "H" level and is then turned to an "L" level, and, thereafter, the signal BLQ is turned to an "H" level. In contrast, according to the second embodiment, the signal BLQ may be maintained in an "H" level after being turned to an "H" level until discharging of the node SEN finishes, and switching of other signals is unnecessary.

In addition, there is an advantage in that noise is reduced as compared with the first embodiment. In the first embodiment, the sense node SEN is exposed to noise due to switching between HLL and BLQ. In contrast, in the second embodiment, the sense node SEN is exposed to noise due to BLQ only.

3. Third Embodiment

Next, a semiconductor memory device according to the third embodiment will be described. A difference between the present embodiment and the first embodiment is that not only the node LSA but also the node CLK is used when the node LBUS is discharged. Hereinafter, only the difference from the first embodiment will be described.

3.1 Configuration of Sense Module

Figure 12:
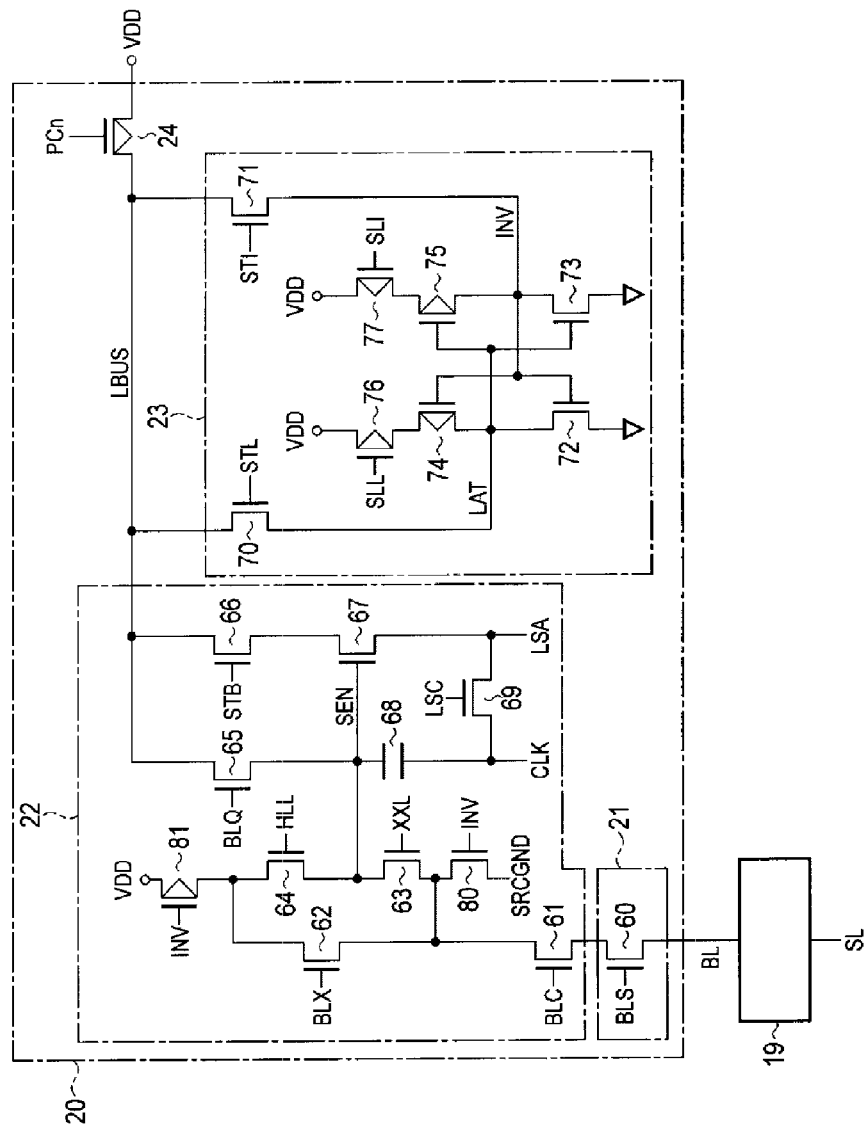
FIG. 12 is a circuit diagram of a sense module according to a third embodiment.

FIG. 12 is a circuit diagram of a sense module 20 according to the present embodiment. As shown in FIG. 12, a difference from FIG. 3 described in the first embodiment is that the sense amplifier 22 further includes an n-channel MOS transistor 69.

The transistor 69 has one end of the current path connected to the source (the node to which the signal LSA is applied) of the transistor 67, the other end thereof connected to the other electrode (the node to which the signal CLK is applied) of the capacitive element 68, and a gate to which a signal LSC is applied. The signal LSC is applied, for example, by the control circuit 18.

3.2 Data Reading Operation

Figure 13:
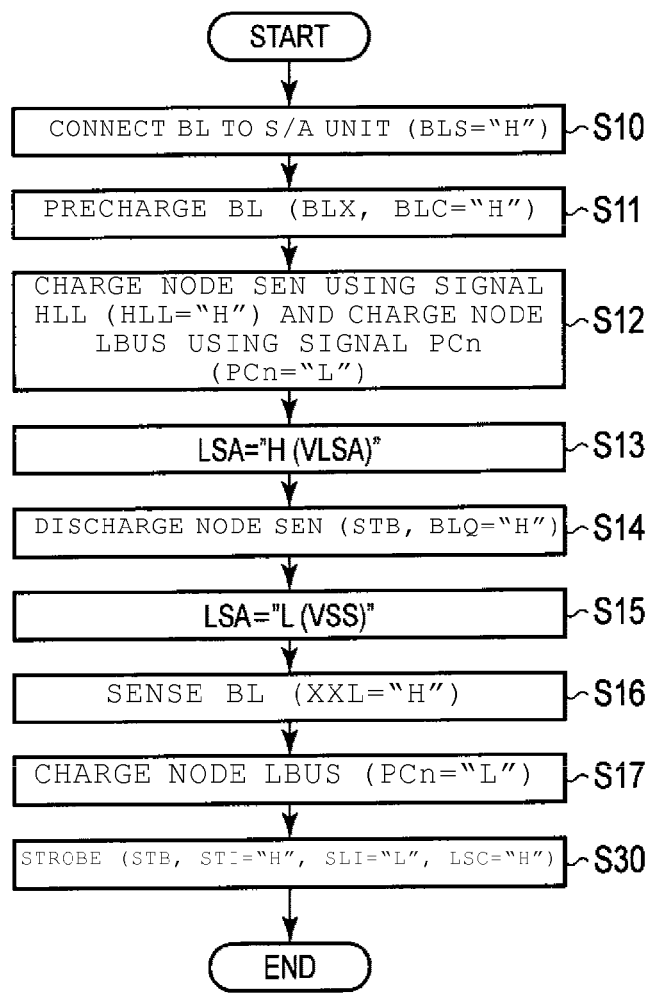
FIG. 13 is a flowchart illustrating a reading operation according to a third embodiment.

A data reading operation according to the present embodiment will be described. FIG. 13 is a flowchart illustrating a flow of an operation of the sense module 20, and FIG. 14 is a timing chart illustrating potentials of various control signals and various nodes.

Figure 14:
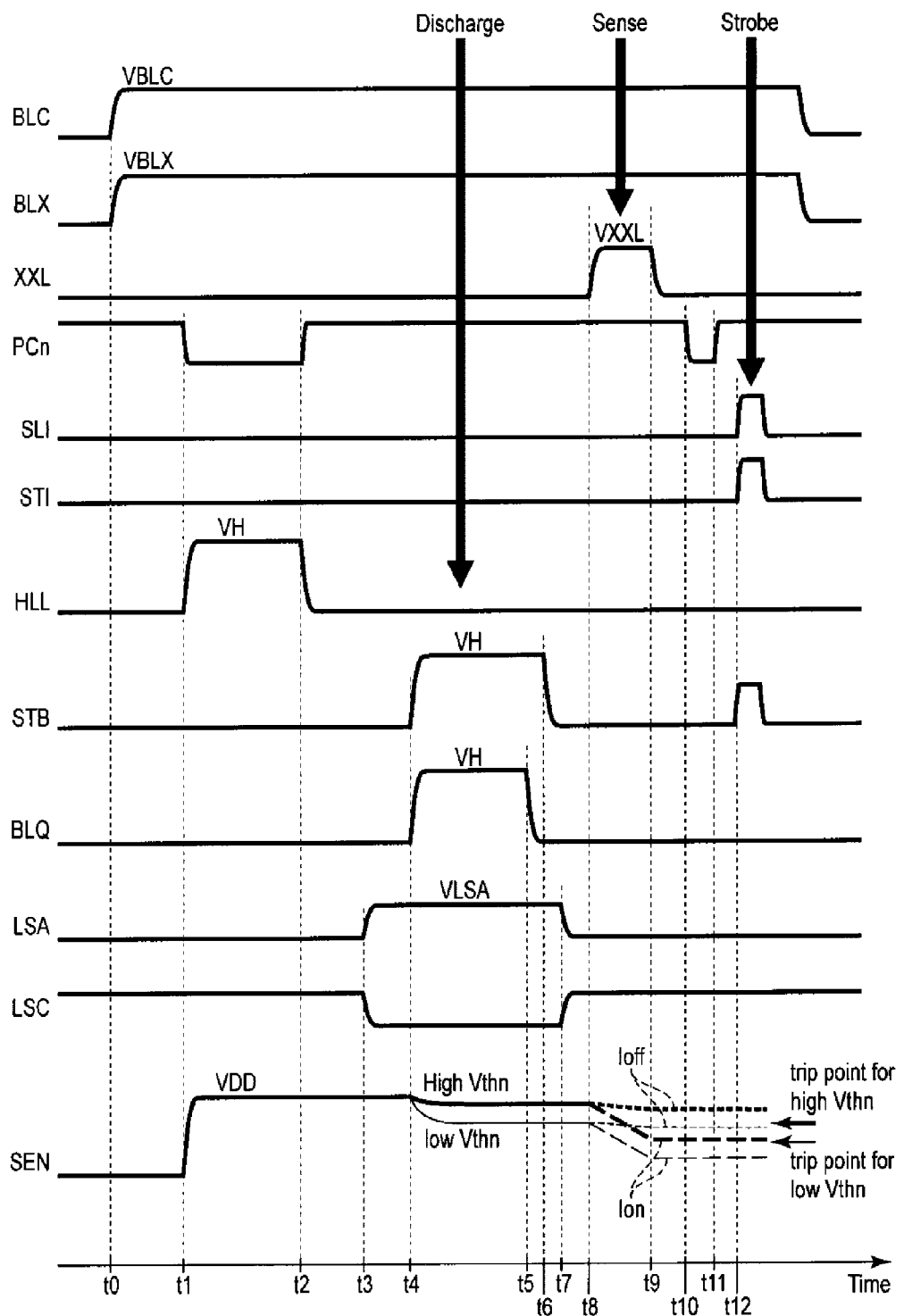
FIG. 14 is a timing chart of various signals in the reading operation according to the third embodiment.

As shown in FIGS. 13 and 14, a difference between the present embodiment and the first embodiment described with reference to FIG. 5 is that the signal LSC is further turned to an "H" level when the strobing is performed in step S18 (step S30). In other words, the control circuit 18 sets the signal LSC to an "H" level in step S30. Then, the transistor 69 is turned on. Therefore, electric charge of the node LBUS is released using the line transmitting the signal CLK as well as the line transmitting the signal LSA.

In addition, as shown in FIG. 14, the signal LSC may be in an "H" level at all times other than the initial discharging of the node SEN to (VLSA+Vthn), and, as described above, may be in an "H" level only in the strobe period at the time point t12. In addition, the signal CLK is in an "L" level at all times during the reading operation.

3.3 Effects According to Present Embodiment

Figure 15:
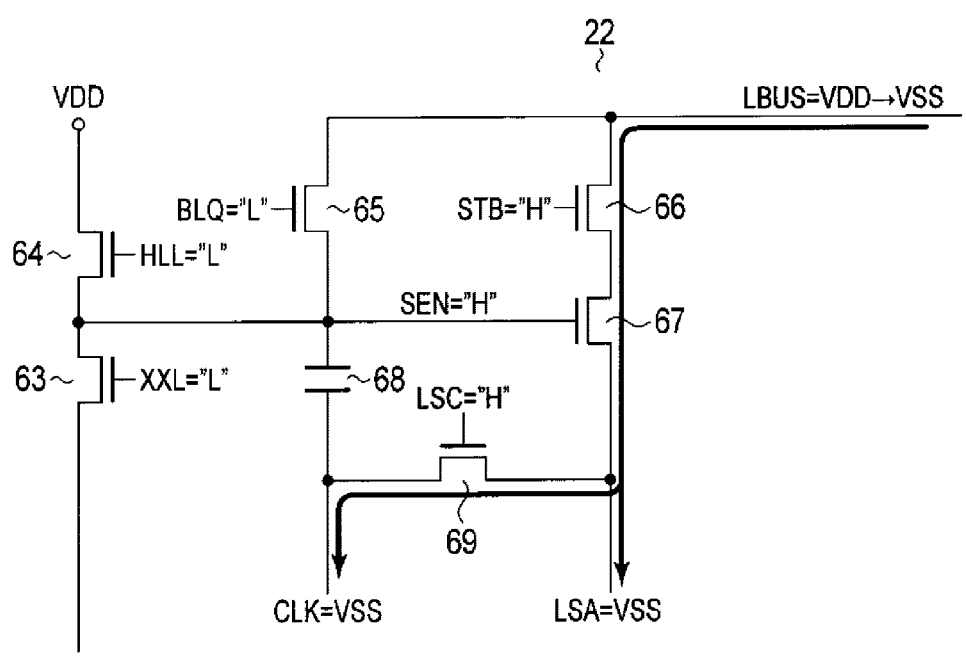
FIG. 15 is a circuit diagram of a sense module according to a third embodiment.

According to the configuration according to the present embodiment, reading speed can be improved. This effect will be described with reference to FIG. 15. FIG. 15 is a circuit diagram of the sense amplifier 22 during strobing.

As shown in FIG. 15, the node LBUS is charged to the voltage VDD immediately before strobing. Thereafter, if the node SEN is maintained in an "H" level when the strobing is performed, electric charge of the node LBUS is discharged by the transistors 66 and 67.

At this time, in the present embodiment, the node LBUS is discharged using the line for CLK as well as the line for LSA. In other words, the discharging is performed using the two lines. Therefore, the time required to discharge the node LBUS can be reduced, and thereby reading speed can be improved.

3.4 Modification Example of Present Embodiment

Figure 16:
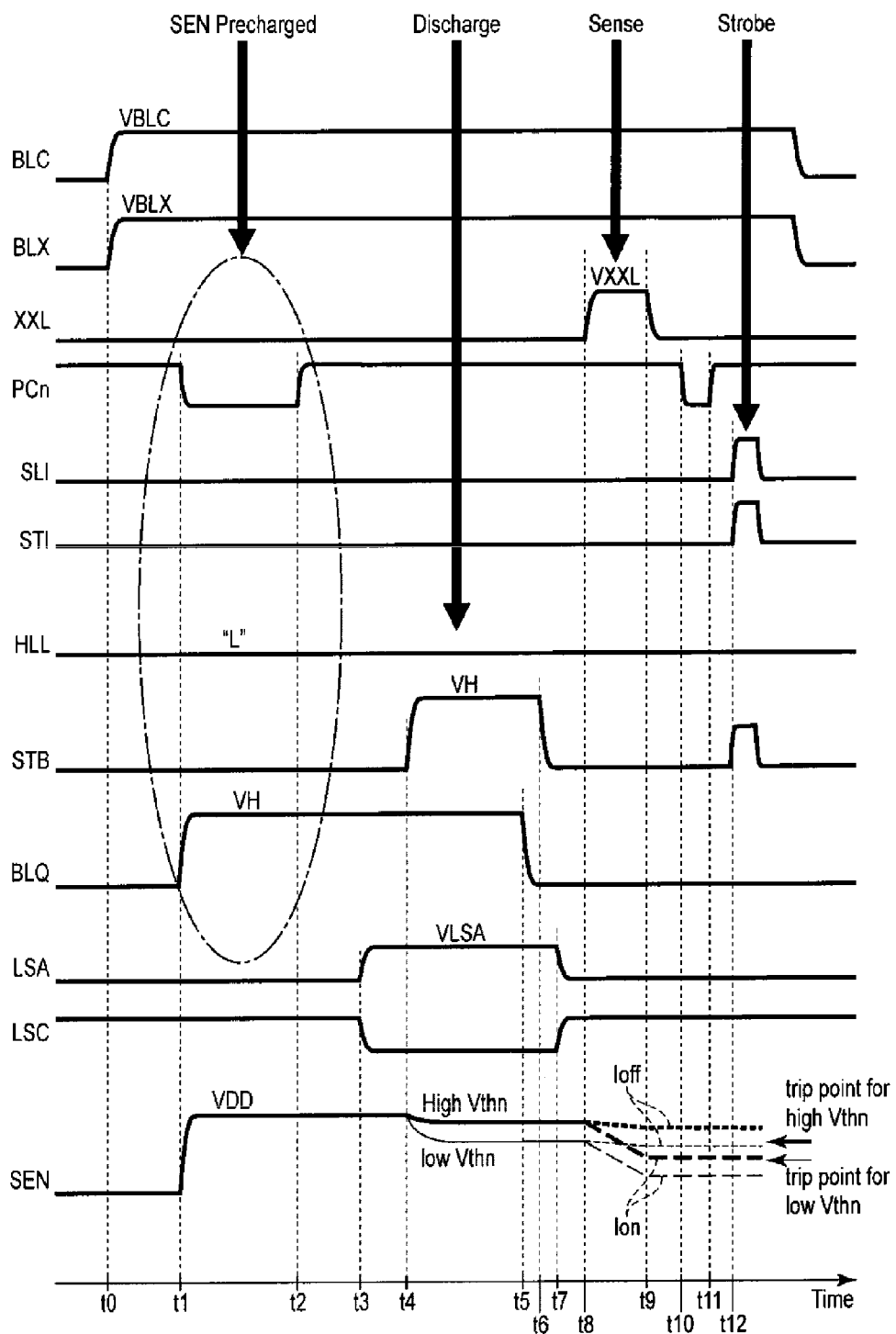
FIG. 16 is a timing chart of various signals in a reading operation according to a modification of the third embodiment.

The above-described third embodiment may be applied to the second embodiment. FIG. 16 is a timing chart illustrating potentials of various control signals and various nodes when data is read in this case.

As shown in FIG. 16, as described in the third embodiment, discharging may be performed using the line for CLK, and precharging of the node SEN may also be performed using the signal BLQ.

4. Fourth Embodiment

Next, a semiconductor memory device according to the fourth embodiment will be described. A difference between the present embodiment and the first embodiment is that an initially charged voltage of the node SEN by the signal HLL is set to a value which depends on a threshold value of the n-channel MOS transistor of the sense amplifier, and thereby influence of the global threshold value disparity is canceled out by the initially charged voltage. Hereinafter, only the difference from the first embodiment will be described.

4.1 Configuration of Voltage Generation Circuit 17

First, a generation circuit 80 of a voltage VHLL and a voltage VLSA of the voltage generation circuit 17 will be described with reference to a circuit diagram of FIG. 17.

Figure 17:
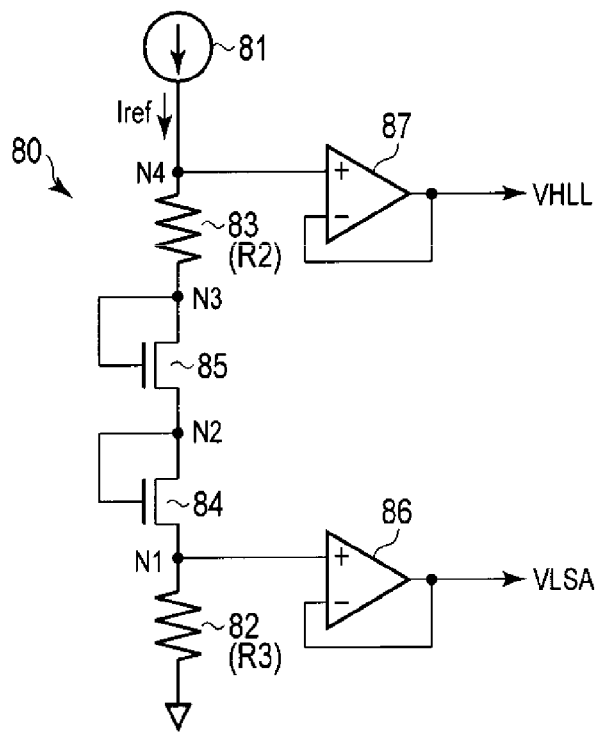
FIG. 17 is a circuit diagram of a voltage generation circuit according to a fourth embodiment.

As shown in FIG. 17, the circuit 80 includes a current source circuit 81, resistive elements 82 and 83, n-channel MOS transistors 84 and 85, and comparators 86 and 87.

The resistive element 82 has one end connected to the ground potential, and the other end connected to a node N1. The comparator 86 has a non-inverting input terminal connected to the node N1 and an inverting input terminal connected to an output terminal, and outputs a voltage of the node N1 as a voltage VLSA. The transistor 84 is diode-connected between the node N1 and a node N2. In other words, the transistor 84 has a source connected to the node N1, and a gate and a drain connected to the node N2. The transistor 85 is diode-connected between the node N2 and a node N3. In other words, the transistor 85 has a source connected to the node N2, and a gate and a drain connected to the node N3. The transistors 84 and 85 have a threshold voltage of the same magnitude as the sense transistor 67. The resistive element 83 has one end connected to the node N3 and the other end connected to a node N4. The comparator 87 has a non-inverting input terminal connected to the node N4 and an inverting input terminal connected to an output terminal, and outputs a voltage of the node N4 as a voltage VHLL. The current source 81 supplies a current Iref to the node N4. In addition, a configuration for generating the voltage VLSA in FIG. 17 is the same as in a case of the first embodiment.

Figure 18:
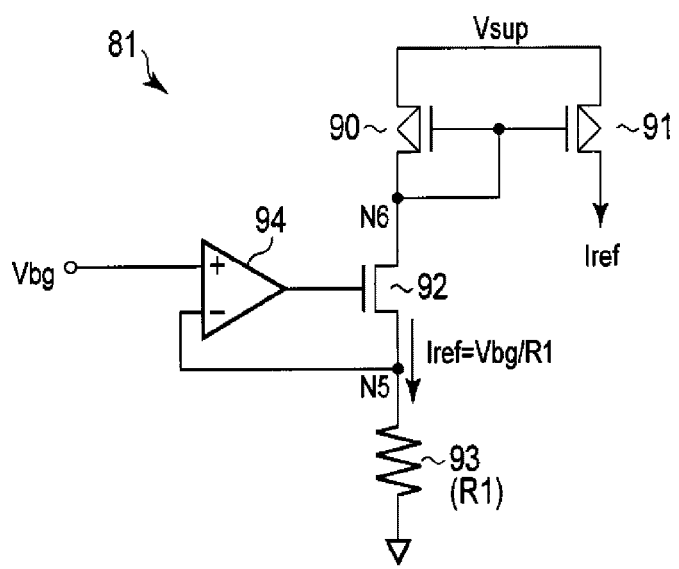
FIG. 18 is a circuit diagram of a current source according to the fourth embodiment.

FIG. 18 is a circuit diagram of the current source circuit 81. As shown in FIG. 18, the circuit 81 includes p-channel MOS transistors 90 and 91, an n-channel MOS transistor 92, a resistive element 93, and a comparator 94.

The transistors 90 and 91 form a current mirror circuit. In other words, the transistors 90 and 91 have gates which are connected in common to each other and are connected to a node N6, and drains to which a power supply voltage Vsup is applied. In addition, a drain current of the transistor 91 is output as the current Iref. In addition, a source of the transistor 90 is connected to the node N6. The transistor 92 has a drain connected to the node N6, and a source connected to a node N5. The resistive element 93 has one end connected to the node N5 and the other end connected to the ground potential. The comparator 94 has an inverting input terminal connected to the node N5 and a non-inverting input terminal to which a bandgap reference voltage Vbg is applied, compares a potential of the node N5 with the voltage Vbg, and inputs a comparison result to the gate of the transistor 92. In this configuration, the current Iref is given by (Vbg/R1). Here, R1 is a resistance value of the resistive element 93.

Figure 19:
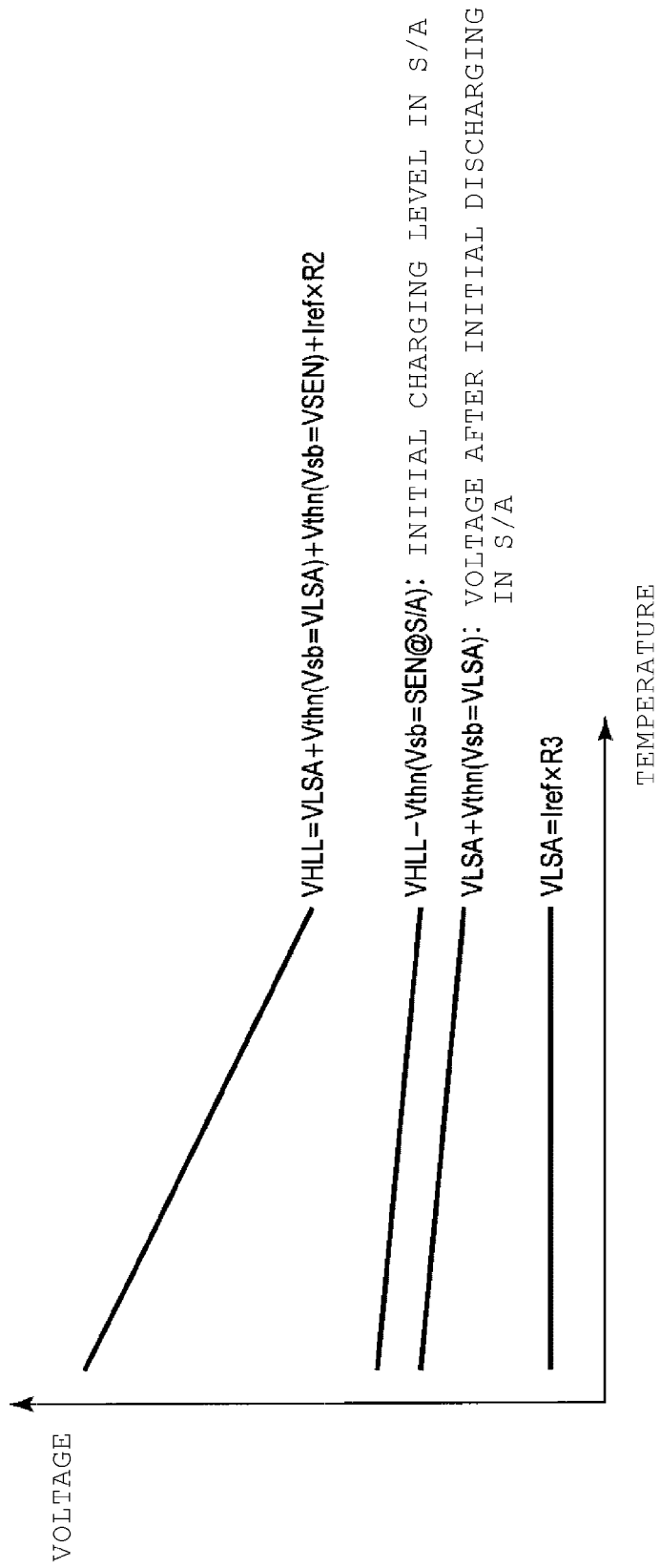
FIG. 19 is a graph illustrating temperature characteristics of voltages.

FIG. 19 is a graph illustrating temperature characteristics of voltages. As shown in FIG. 19, the voltage VLSA generated by the circuit of FIG. 17 is constant regardless of temperature, and is represented by the following Equation (6).

$$VLSA = (Iref \times R3) \quad (6)$$

Here, R3 is a resistance value of the resistive element 82.

In addition, the voltage VHLL decreases with temperature, and is represented by the following Equation (7).

$$VHLL = VLSA + Vthn(Vsb=VLSA) + Vthn(Vsb=VSEN) + (Iref \times R2) \quad (7)$$

Here, Vthn(Vsb=VLSA) is a threshold voltage of the n-channel MOS transistor (the transistors 64 to 67 included in the sense amplifier 22 or the transistors 84 and 85) when a substrate potential (a source potential) is VLSA. In addition, Vthn(Vsb=VSEN) is a threshold voltage of the n-channel MOS transistor when a substrate potential (a source potential) is VSEN. Further, VSEN is a potential of the node N2 and is indicated by (VLSA+Vthn(Vsb=VLSA)), and this potential is the same as a voltage after the node SEN is initially discharged and has smaller temperature dependency than VHLL. Furthermore, an initially charged voltage of the node SEN is indicated by (VHLL−Vthn (Vsb=SEN)) and has the substantially same temperature dependency as VSEN. Here, Vthn(Vsb=SEN) is a threshold voltage of the n-channel MOS transistor when a substrate potential is a potential of the node SEN.

4.2 Data Reading Operation

Figure 20:
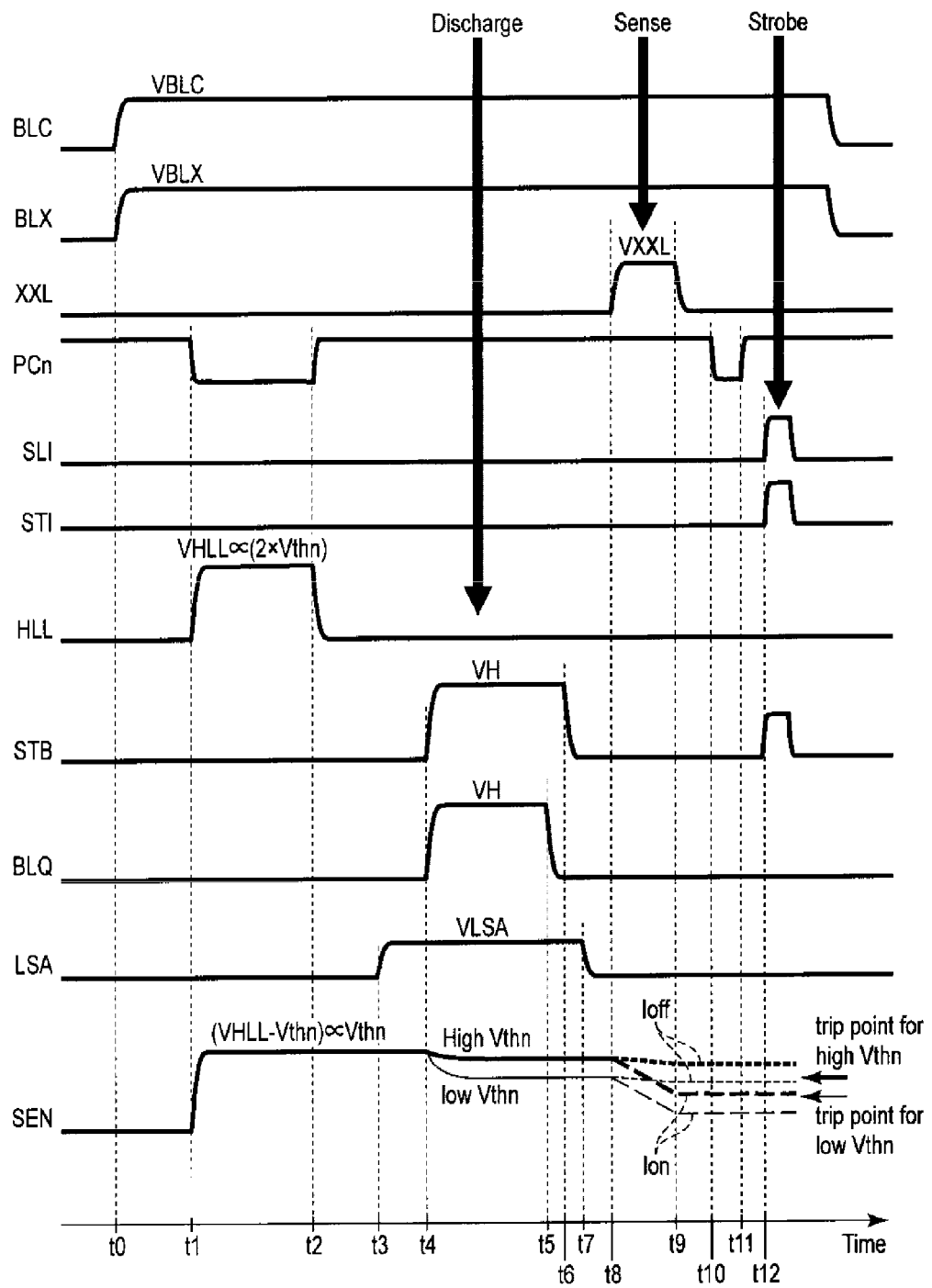
FIG. 20 is a timing chart of various signals in a reading operation according to the fourth embodiment.

A data reading operation according to the present embodiment will be described. FIG. 20 is a timing chart illustrating potentials of various control signals and various nodes.

As shown in FIG. 20, a difference between the present embodiment and the first embodiment described with reference to FIGS. 5 to 7 is that the voltage VHLL described with reference to FIG. 19 is applied as a signal HLL in step S12. In other words, a voltage of the signal HLL applied to the gate of the transistor 64 in the present embodiment is a value proportional to (2×Vthn) (refer to the above Equation (7)). Then, an initially charged voltage of the node SEN is (VHLL−Vthn) which is a value proportional to Vthn. The remaining parts are the same as in the first embodiment.

4.3 Effects According to Present Embodiment

According to the configuration according to the present embodiment, reading speed can be improved. This effect will be described below.

As described in the first embodiment, threshold value disparities include a global disparity (a disparity for the overall sense amplifier) and a local disparity (a disparity for each transistor). In addition, in the first embodiment, both of the disparities are handled using the initial discharging operation to (VLSA+Vthn) of the node SEN. However, in this case, if a disparity in Vthn is large, the time required for an initial discharging operation may be lengthened in a sense circuit with very small Vthn.

Therefore, in the present embodiment, the local Vthn disparity is compensated using the method described in the first embodiment, and the global Vthn disparity is compensated by setting the signal HLL to a value which depends on Vthn. Thus, the initial discharging time of the node SEN can be reduced so as to prevent reading speed from being reduced.

More specifically, the node SEN is clamped using the voltage VHLL when the node SEN is charged using the signal HLL. At this time, VHLL is set to a value proportional to (2×Vthn), and thereby an initially charged voltage of the node SEN can be made to depend on the global Vthn disparity of the n-channel MOS transistor. Thereby, a voltage may decrease by the local Vthn disparity at most when the node SEN is initially discharged, and the discharging time can be reduced.

In addition, a potential of the node SEN after being initially discharged is (VLSA+Vthn), and this Vthn is a value when the substrate voltage Vsb is VLSA. Therefore, an initially charged voltage of the node SEN is also required to be set to a value which depends on not Vsb=0 V but Vsb=VLSA. Accordingly, it is possible to generate the voltage VHLL which depends on Vthn (Vsb=VLSA) as described in Equation (7) by using the circuit as shown in FIG. 17.

Figure 21:
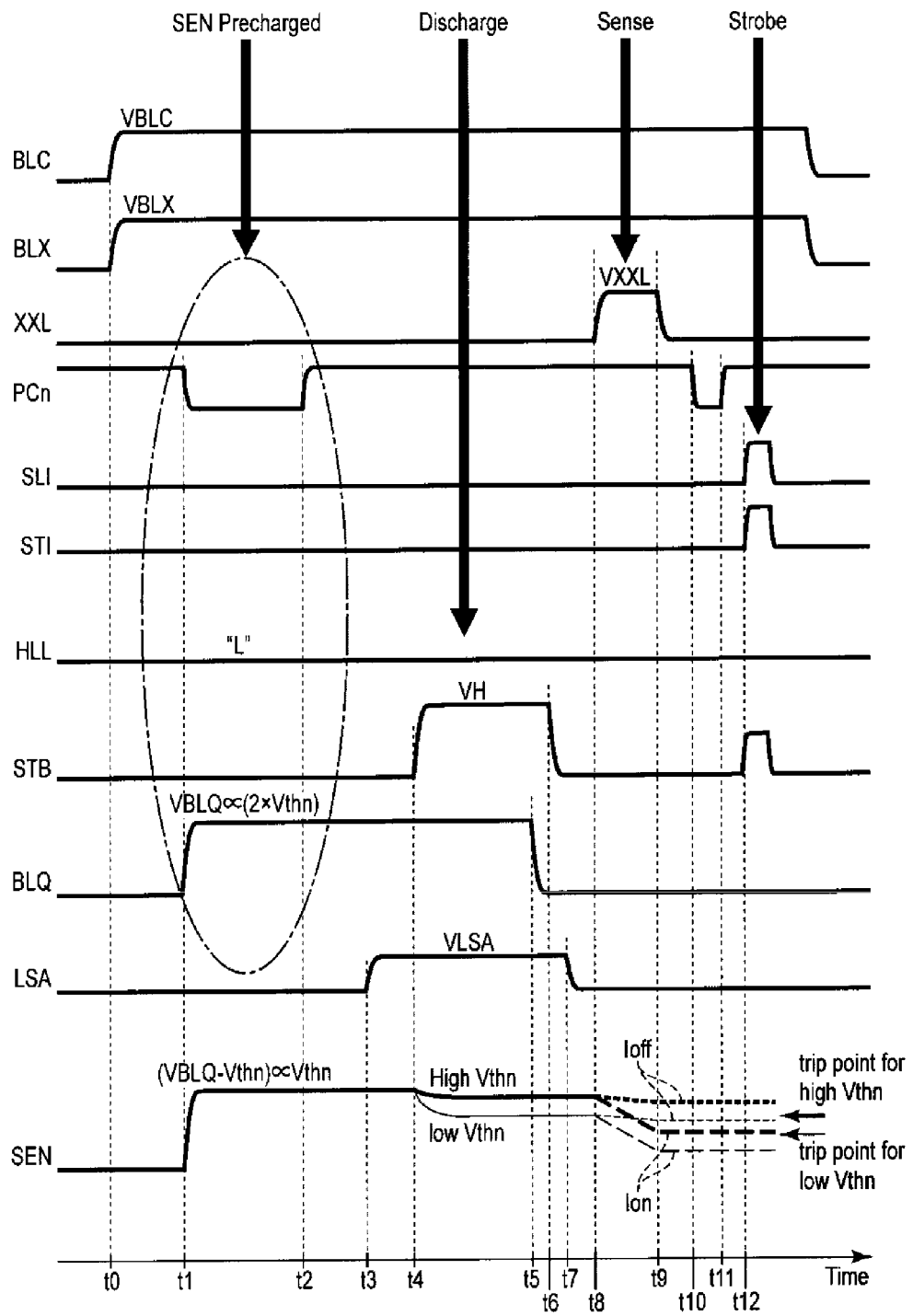
FIG. 21 is a timing chart of various signals in the reading operation according to the fourth embodiment.

In addition, the present embodiment may be applied to the above-described second and third embodiments. In a case of being applied to the second embodiment, the signal VHLL described with reference to FIG. 17 may be used as the signal BLQ described with reference to FIG. 11. FIG. 21 is a timing chart illustrating potentials of the respective control signals and nodes. In this example, a voltage VBLQ which is proportional to (2×Vthn) is used as a voltage of the signal BLQ which is in an "H" level. Also in this example, the same effect can be achieved.

5. Fifth Embodiment

Next, a semiconductor memory device according to the fifth embodiment will be described. A difference between the present embodiment and the first embodiment is that a potential of the node SEN increases through coupling with the signal CLK. Hereinafter, only the difference from the first embodiment will be described.

5.1 Data Reading Operation

A data reading operation according to the present embodiment will be described. A configuration of the NAND type flash memory 1 is the same as in the first embodiment, and thus description thereof will be omitted.

Figure 22:
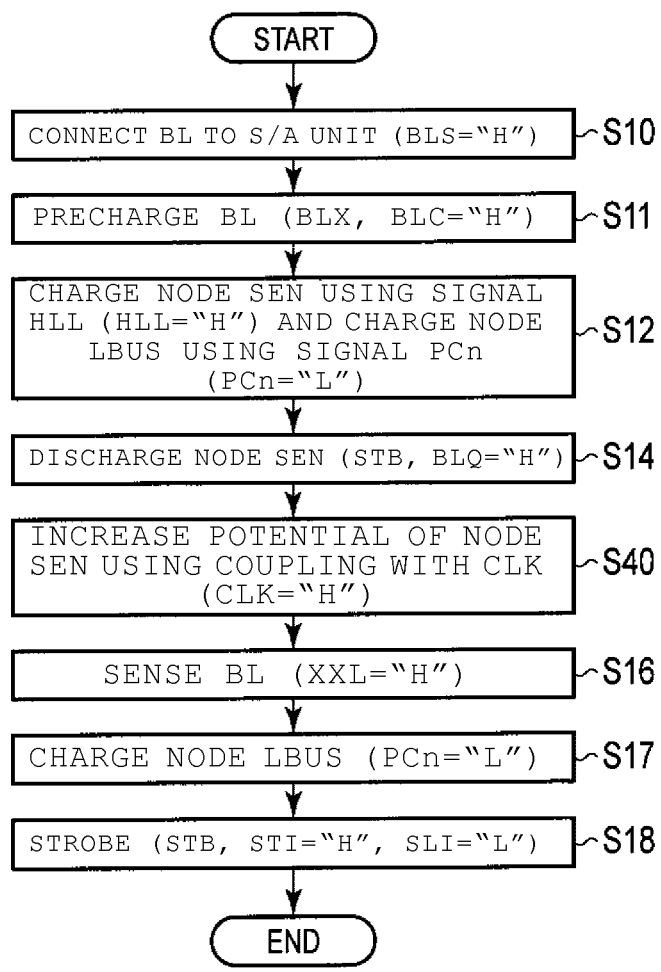
FIG. 22 is a flowchart illustrating a reading operation according to a fifth embodiment.
Figure 23:
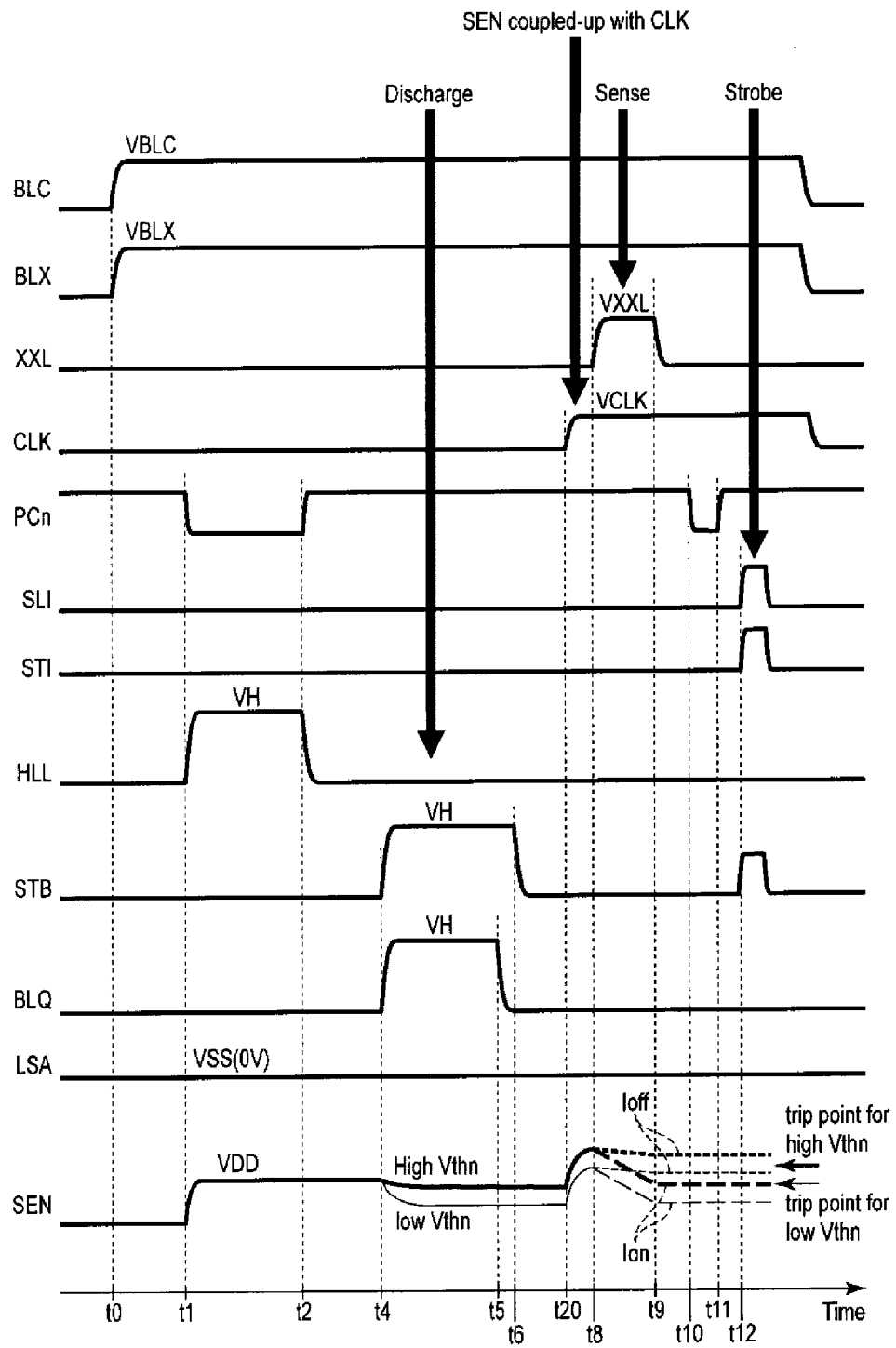
FIG. 23 is a timing chart of various signals in the reading operation according to the fifth embodiment.

FIG. 22 is a flowchart illustrating a flow of an operation of the sense module 20, and FIG. 23 is a timing chart illustrating potentials of various control signals and various nodes.

As shown in FIGS. 22 and 23, differences between the present embodiment and the first embodiment described with reference to FIG. 5 are as follows. First, steps S13 and S15 in FIG. 5 are omitted. Therefore, the signal LSA is VSS at all times.

Next, a potential of the node SEN increases due to coupling with CLK after the initial discharging in step S14 (step S40). In other words, the control circuit 18 sets the signal CLK to an "H" level (a voltage VCLK) in step S40 (the time point t20). Then, a potential of the node SEN increases from Vthn due to coupling with the voltage VCLK (refer to the time points t20 to t8 of FIG. 23).

Thereafter, the processes are performed from step S16.

5.2 Effects According to Present Embodiment

According to the configuration according to the present embodiment, the method described in the first embodiment is applicable even to a semiconductor memory device with a relatively low power supply voltage VDD. This effect will be described below.

As described in the first embodiment, the voltage VLSA has the upper limit and the lower limit. In relation to this fact, in such an operation condition in which the power supply voltage VDD cannot be sufficiently heightened, there is a case where a sufficient voltage headroom is not obtained, and VLSA is not easy to set to an appropriate value.

Therefore, in the present embodiment, CLK is turned to an "H" level after the node SEN is initially discharged without using VLSA. Then, a potential of the node SEN increases due to coupling with CLK, and then a subsequent sensing operation can be performed.

In addition, the signal LSA is also coupled with the node SEN via the sense transistor 67, but LSA is required to be set to an "L" level before strobing. Therefore, in coupling-up of the node SEN, LSA is made to be in an "L" level at all times by using not VLSA but CLK.

Further, according to the present embodiment, the signal LSA may be maintained at VSS. Therefore, a temperature characteristic of LSA is not required to be taken into consideration.

Furthermore, the present embodiment may be applied to the second or third embodiment as it is.

6. Sixth Embodiment

Next, a semiconductor memory device according to the sixth embodiment will be described. A difference between the present embodiment and the first embodiment is that the power supply voltage is used as VLSA by increasing a potential of the node SEN through coupling with CLK before initial discharging. Hereinafter, only the difference from the first embodiment will be described.

6.1 Data Reading Operation

A data reading operation according to the present embodiment will be described. A configuration of the NAND type flash memory 1 is the same as in the first embodiment, and thus description thereof will be omitted.

Figure 24:
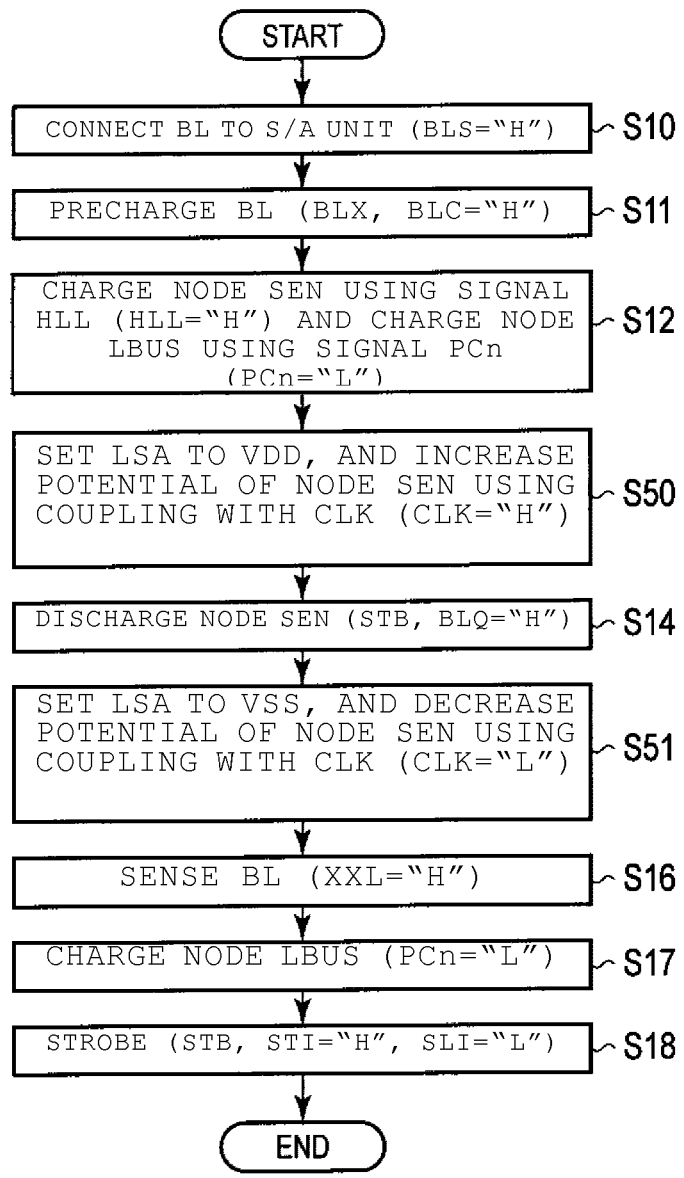
FIG. 24 is a flowchart illustrating a reading operation according to a sixth embodiment.
Figure 25:
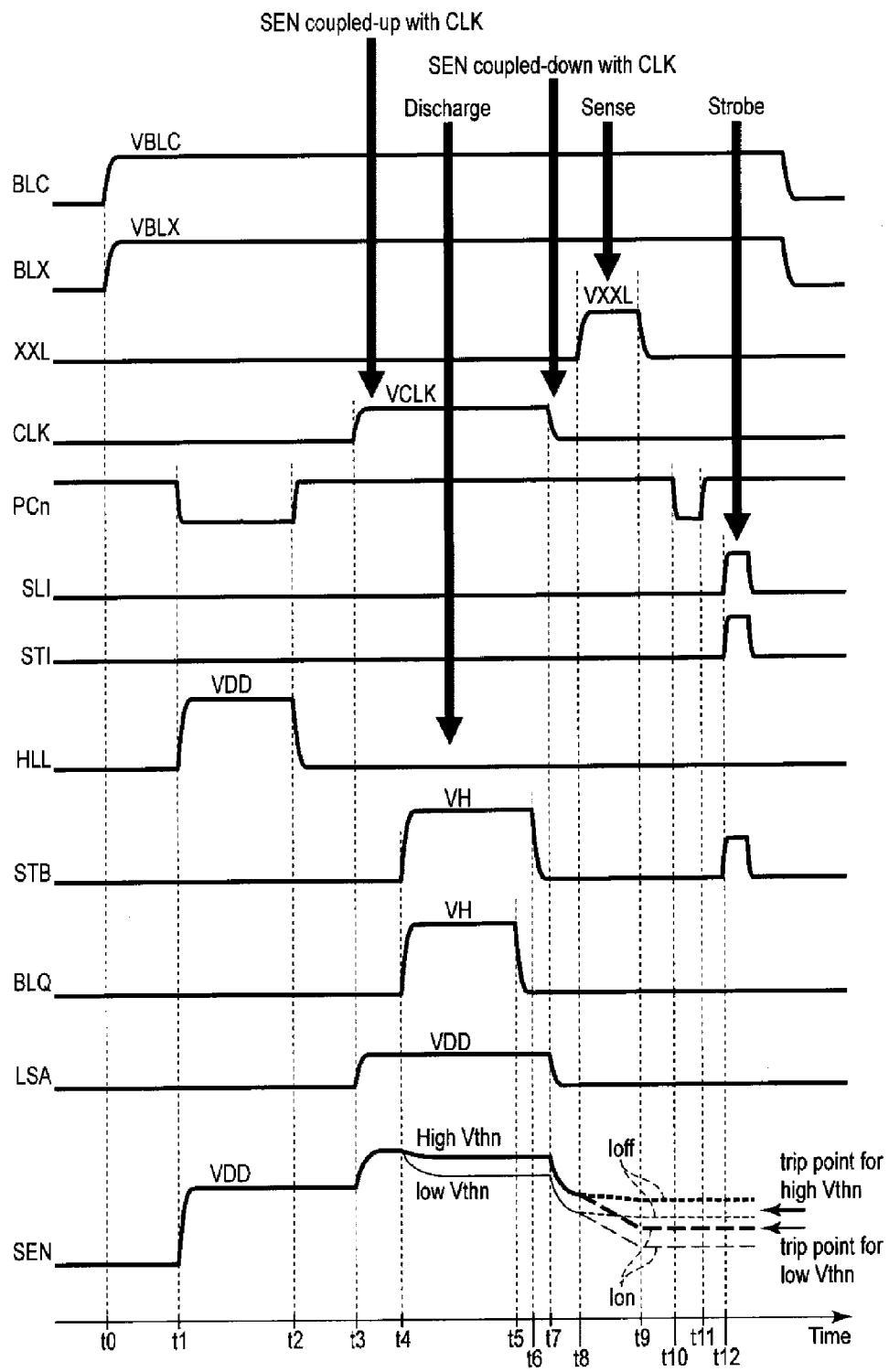
FIG. 25 is a timing chart of various signals in the reading operation according to the sixth embodiment.

FIG. 24 is a flowchart illustrating a flow of an operation of the sense module 20, and FIG. 25 is a timing chart illustrating potentials of various control signals and various nodes.

As shown in FIGS. 24 and 25, differences between the present embodiment and the first embodiment described with reference to FIG. 5 are as follows. First, in step S13 of FIG. 5, the signal LSA is turned to an "H" level, and a voltage of the node SEN increases through coupling with CLK (step S50). In other words, the control circuit 18 increases a potential of CLK from VSS to VCLK (the time point t3). Then, a potential of the node SEN increases from VDD through the coupling with CLK.

Successively, after the process in step S14 is performed, in step S15 of FIG. 5, the signal LSA is turned to an "L" level, and a voltage of the node SEN decreases due to coupling with CLK (step S51). In other words, the control circuit 18 decreases a potential of CLK from VCLK to VSS (the time point t7). Then, a potential of the node SEN is reduced due to the coupling with CLK.

Thereafter, the processes are performed from step S16.

6.2 Effects According to Present Embodiment

According to the configuration according to the present embodiment, a circuit configuration can be simplified since the power supply voltage VDD can be used as the signal LSA. This effect will be described below.

In the present embodiment, CLK is turned to an "H" level before the initial discharging of the node SEN starts, and thereby a potential of the node SEN is set to a value higher than VDD due to coupling with CLK. In addition, CLK is turned to an "L" level after the node SEN becomes (VDD+ Vthn) through the initial discharging, and thereby a potential of the node SEN returns to the original level.

By using this method, the power supply voltage VDD can be used as the signal LSA. The power supply voltage has a sufficient drive performance, and is a voltage which is easily used since the temperature characteristic is also suppressed so as to be low. Therefore, a circuit configuration can be simplified as compared with the first to fourth embodiments of using the voltage VLSA set to a predetermined voltage value by the circuit 80 unlike VDD or VSS.

7. Seventh Embodiment

Next, a semiconductor memory device according to the seventh embodiment will be described. A difference between the present embodiment and the first embodiment is that the node LBUS is electrically disconnected from the sense amplifier 22 during a period when the node SEN is initially discharged. Hereinafter, only the difference from the first embodiment will be described.

7.1 Configuration of Sense Module

Figure 26:
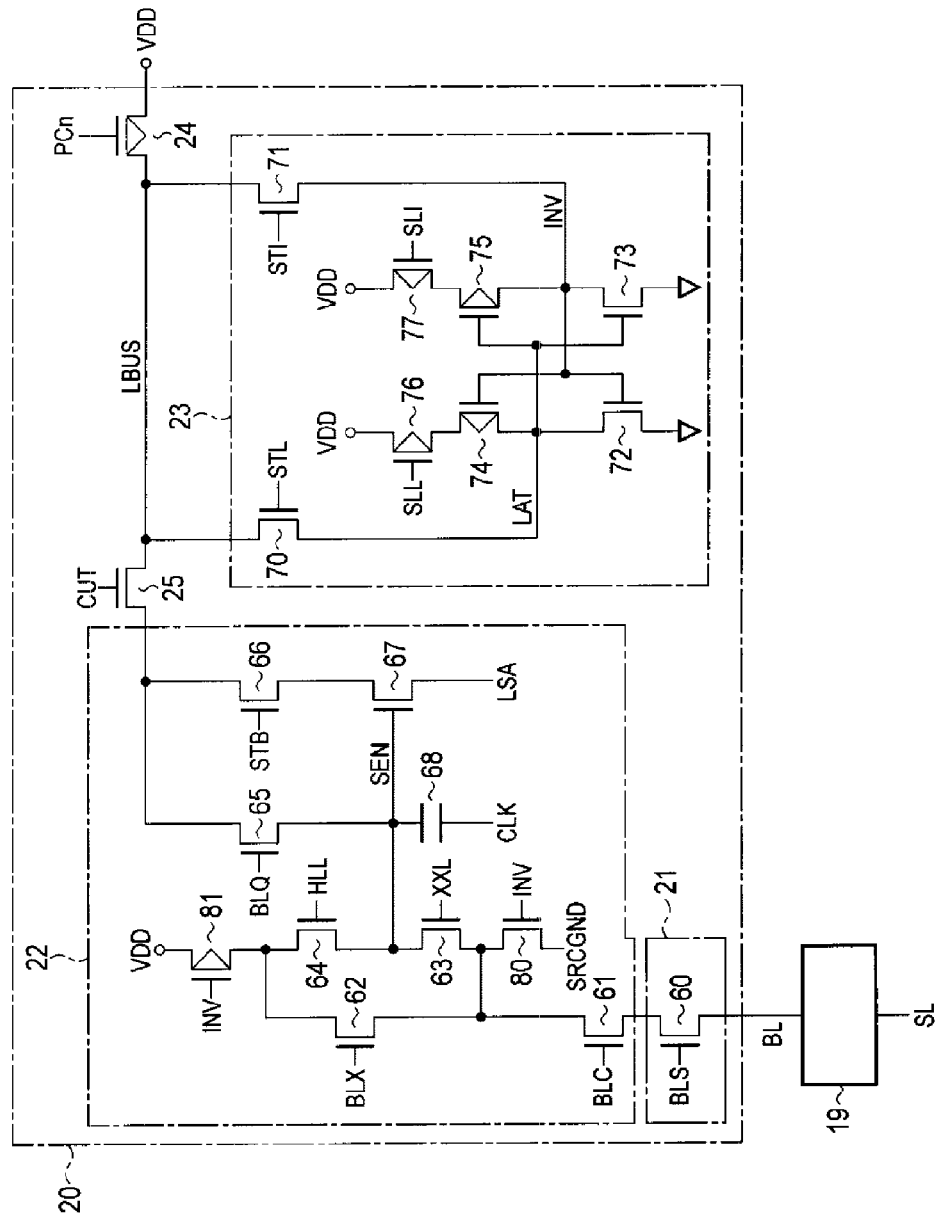
FIG. 26 is a circuit diagram of a sense module according to a seventh embodiment.

FIG. 26 is a circuit diagram of the sense module 20 according to the present embodiment. As shown in FIG. 26, a difference from the first embodiment described with reference to FIG. 3 is that the sense module 20 further includes an n-channel MOS transistor 25.

The transistor 25 has one end of the current path connected to the drains of the transistors 65 and 66, the other end thereof connected to the node LBUS, and a gate to which a signal CUT is applied. The signal CUT is applied, for example, by the control circuit 18.

7.2 Data Reading Operation

Figure 27:
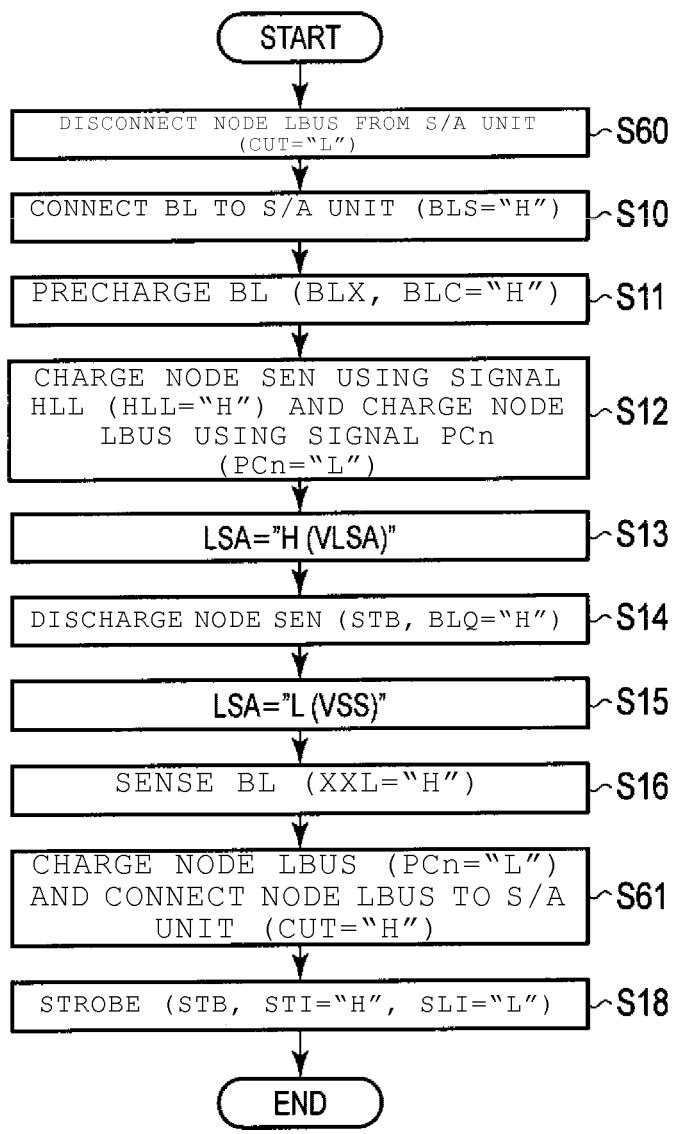
FIG. 27 is a flowchart illustrating a reading operation according to a seventh embodiment.

A data reading operation according to the present embodiment will be described. FIG. 27 is a flowchart illustrating a flow of an operation of the sense module 20, and FIG. 28 is a timing chart illustrating potentials of various control signals and various nodes.

Figure 28:
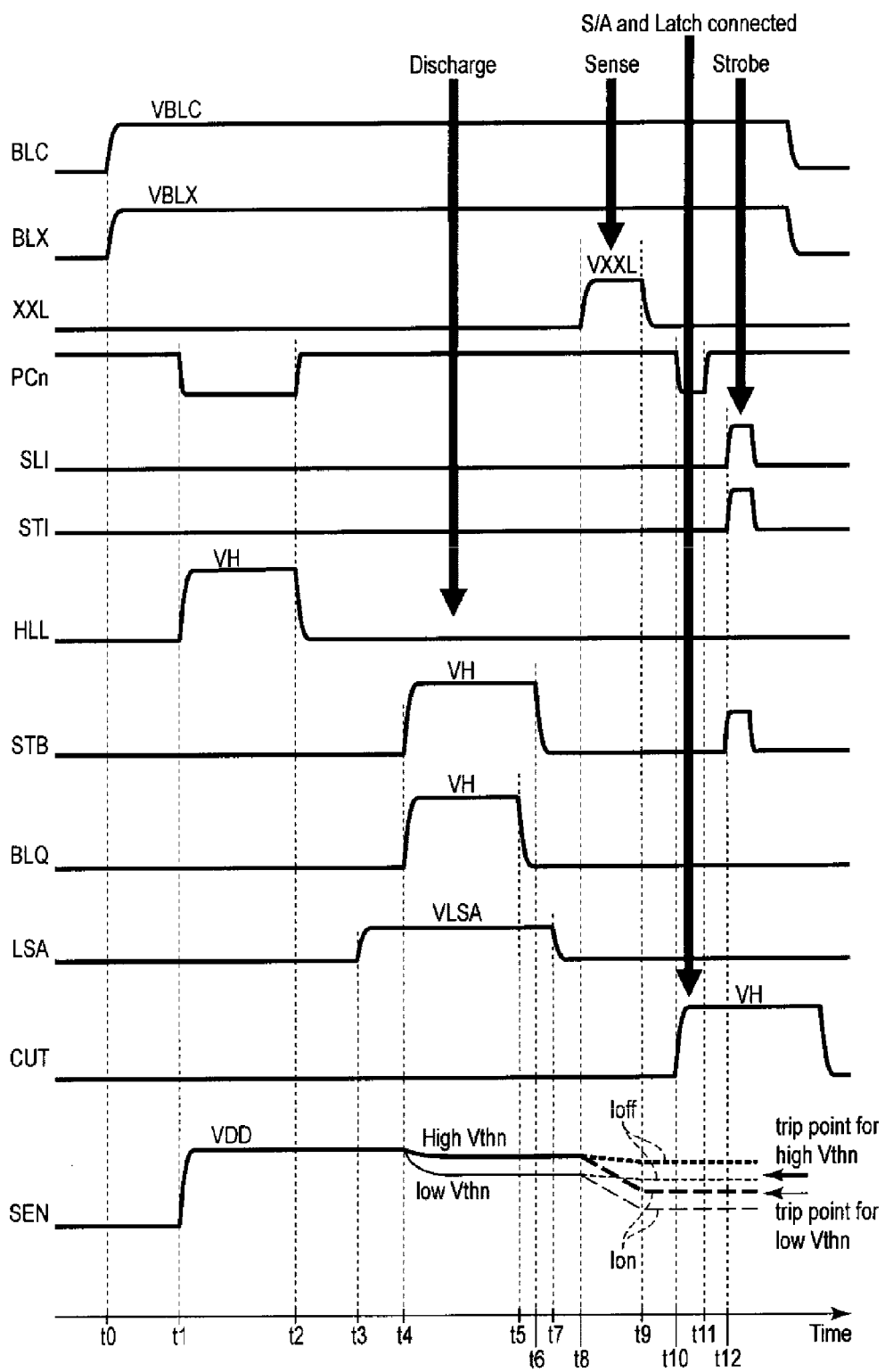
FIG. 28 is a timing chart of various signals in the reading operation according to the seventh embodiment.

As shown in FIGS. 27 and 28, differences between the present embodiment and the first embodiment described with reference to FIG. 5 are as follows. First, the node LBUS is electrically disconnected from the sense amplifier 22 (step S60) before the bit line BL is connected to the sense amplifier (step S10). In other words, the control circuit 18 sets the signal CUT to an "L" level, and thereby the transistor 25 is turned off.

Second, in step S17 described in FIG. 5, the node LBUS is charged, and the node LBUS is also connected to the sense amplifier 22 (step S61). In other words, the control circuit 18 sets the signal CUT to an "H" level when read data is transmitted to the data latch 23, thereby turning on the transistor 25 (the time point t10). A potential of the signal CUT is, for example, the voltage VH which allows VDD to be transmitted to the transistor 25.

The remaining parts are the same as in the first embodiment.

7.3 Effects According to Present Embodiment

According to the configuration according to the present embodiment, reading speed can be improved.

According to the present embodiment, the sense amplifier 22 is disconnected from the node LBUS by the transistor 25 when the node SEN is initially discharged. Therefore, during this period, capacitances of the node LBUS and the peripheral lines are not observed from the node SEN. For this reason, the initial discharging can be rapidly performed.

In addition, the present embodiment may be applied to the second to sixth embodiments.

8. Modification Examples and the Like

As described above, the semiconductor memory device 1 according to the embodiments includes a plurality of memory cells stacked on the semiconductor substrate, a bit line which is electrically connected to any one of the memory cells, and a sense module (20 in FIG. 6) which is electrically connected to the bit line. In addition, in the present specification, "electrical connection" includes not only direct connection but also connection via other elements such as a transistor or a resistive element.

The sense module includes first to sixth transistors. The first transistor (Tr62 in FIG. 3) is electrically connected to the bit line. The second transistor (Tr67 in FIG. 3) has a gate connected to a first node (SEN in FIG. 3). The third transistor (Tr63 in FIG. 3) is electrically connected to the bit line and the first node (SEN). The fourth transistor (Tr65 in FIG. 3) connects the first node (SEN) to the second node (LBUS in FIG. 3). The fifth transistor (Tr66 in FIG. 3) connects a drain of the second transistor (Tr67) to the second node (LBUS). The sixth transistor (Tr64 in FIG. 3) connects the first node (SEN) to a first voltage node (VDD in FIG. 3).

In addition, during data reading, a gate signal (HLL) of the sixth transistor (Tr64) is asserted (S12 in FIG. 5). Next, gate signals (BLQ and STB) of the fourth and fifth transistors (Tr65 and Tr66) are asserted (S14 in FIG. 5). Next, a gate signal (XXL) of the third transistor (Tr63) is asserted (S16 in FIG. 5). Next, a gate signal (STB) of the fifth transistor (Tr66) is asserted (S18 in FIG. 5).

According to this configuration, the fourth and fifth transistors 65 and 66 are turned on immediately before data is sensed by turning on the third transistor 63, and thereby a potential of the first node SEN is discharged to a value corresponding to a threshold voltage Vthn of the second transistor 67. Vthn is a main factor of a disparity of the first node SEN. Due to this discharging, a potential of the first node SEN is considerably reduced, for example, if the threshold voltage is small, and a potential of the first node SEN is slightly reduced if the threshold voltage is large. As above, a potential of the node SEN immediately before data is sensed is made to vary according to the threshold voltage Vthn of the sense transistor 67. Therefore, the disparity of the sense transistor 67 can be compensated by a potential of the node SEN. As a result, even if an On/Off ratio of cell currents is small, reading errors can be suppressed from occurring, and thereby operation reliability of the semiconductor memory device 1 can be improved.

In addition, embodiments are not limited to the above-described embodiments may have various modifications, and a plurality of embodiments may be combined as much as possible. In addition, the processes in the flowchart described in each embodiment may be changed in order thereof as much as possible.

Further, in the above-described embodiments, the sense amplifier using a method of sensing a current is described as an example. However, the embodiments are applicable to a sense amplifier using a method of sensing a voltage. In the voltage sensing method, a potential of the bit line is varied depending on read data, and this potential variation is detected by the transistor 67. A potential variation of a certain bit line influences a potential of an adjacent bit line due to the capacitive coupling between the bit lines. Therefore, in the voltage sensing method, data is read for each even bit line and for each odd bit line unlike the current sensing method in which data can be simultaneously read from all the bit lines. In addition, a circuit configuration of the sense amplifier is the same as described with reference to FIGS. 3, 12 and 26.

Figure 29:
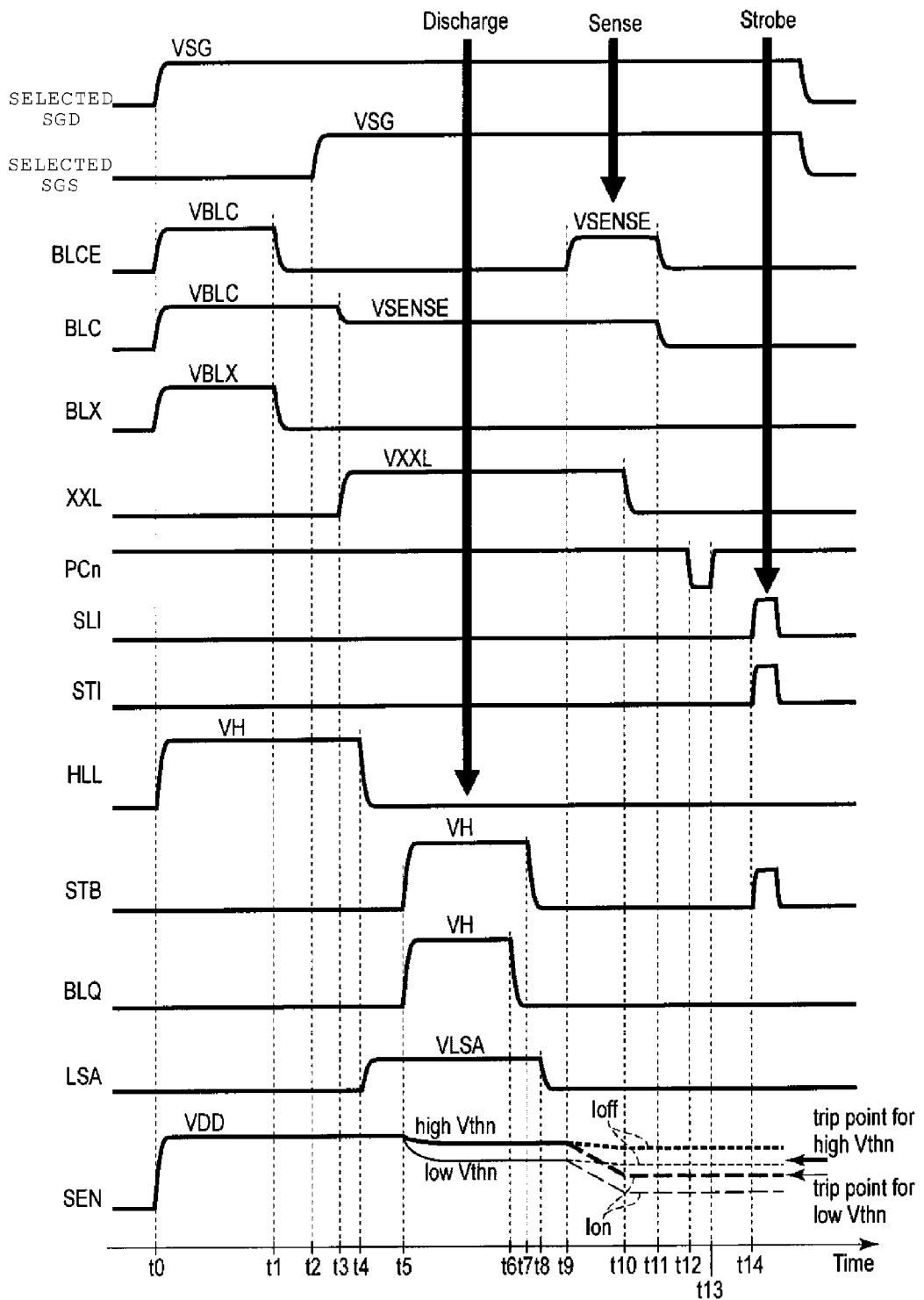
FIG. 29 is a timing chart of various signals in a reading operation according to a modification of the first to seventh embodiments.

FIG. 29 is a timing chart of various control signals in a case where the method described in the first embodiment is applied to the sense amplifier using the voltage sensing method, and shows a state in which an even bit line is selected and an odd bit line is not selected.

As shown in FIG. 29, the control circuit 18 sets signals BLC (respectively indicated by BLCE and BLCO in FIG. 29) for the even bit line and the odd bit line to an "H" level (the voltage VBLC) at the time point t0. The control circuit 18 also sets signals BLX and HLL to an "H" level (VBLX and VH). Further, the control circuit 18 sets the drain side select gate line SGD of the selected string to an "H" level (VSG). Furthermore, the control circuit 18 sets the node INV to an "L" level in the even bit line, sets the node INV to an "H" level in the odd bit line, and sets the node SRCGND to the voltage VSS (for example, 0 V). As a result, the even bit line is precharged to a voltage (VBLC−Vt), and the odd bit line is connected to VSS. Vt is a threshold voltage of the transistor 61. In addition, the node SEN is charged to VDD. Further, VBB is applied to the select gate line SGD which is not selected.

Next, the control circuit 18 sets the signals BLCE and BLX to an "L" level at the time point t1. Thereby, the precharging of the even bit line finishes, and the even bit line enters a floating state at the voltage (VBLC−Vt).

Successively, the control circuit 18 sets the source side select gate line SGS of the selected string to an "H" level (VSG) at the time point t2. Thereby, the even bit line is discharged when a cell current (On-current) flows. VBB is applied to the select gate line SGS which is not selected. A potential of the odd bit line is maintained as VSS.

In addition, the control circuit 18 reduces a potential of the signal BLCO from VBLC to VSENSE and sets the signal XXL to an "H" level (VXXL) at the time point t3. Further, at the time point t4, the signal HLL is set to an "L" level, and the signal LSA is set to an "H" level (VLSA). Thereafter, at the time point t5, the signals STB and BLQ are set to an "H" level (VH). As a result, a potential of the node SEN is discharged to (VLSA+Vthn).

In addition, the control circuit 18 finishes discharging of the node SEN and sets the signal LSA to an "L" level. As described in the first embodiment, the control circuit 18 first sets the signal BLQ to an "L" level (the time point t6), then sets the signal STB to an "L" level (the time point t7), and finally sets the signal LSA to an "L" level (the time point t8).

Next, the control circuit 18 sets the signal BLCE to an "H" level (VSENSE) so as to start sensing data for the even bit line at the time point t9. In other words, if the selected memory cell is turned on and thus the even bit line is discharged, a potential of the node SEN is also reduced. On the other hand, if the selected memory cell is turned off, the even bit line substantially maintains the precharged potential, and thus the potential of the node SEN substantially does not vary. More specifically, if the potential of the even bit line is smaller than (VSENSE−Vt), the transistor 61 is turned on, and thereby the node SEN is discharged. On the other hand, if the potential of the even bit line is greater than (VSENSE−Vt), the transistor 61 is in a state of cut-off, and thereby the node SEN is not discharged.

The control circuit 18 sets the signal XXL to an "L" level so as to finish sensing data at the time point t10. Thereafter, the control circuit 18 charges the node LBUS at the time point t12 and sets the signal STB to an "H" level at the time point t14 so as to strobe data.

In the above-described way, data can be read from the even bit line. This is also the same for a case of reading data from the odd bit line. Of course, not only the first embodiment but also the second to seventh embodiments are applicable to a sense amplifier using the voltage sensing method.

In the above-described embodiments, a semiconductor memory device is described by exemplifying the three-dimensional stacked NAND type flash memory. As a configuration of the three-dimensional stacked NAND type flash memory, for example, a semiconductor layer which functions as a current path (channel) of a NAND string may be formed in a U shape or a single columnar shape. In the latter case, the transistor BT is not necessary. In addition, the embodiments are not limited to the three-dimensional stacked type, and are applicable to a NAND type flash memory or the like in the related art in which memory cells are arranged in a two-dimensional manner on a plane of a semiconductor substrate.

Further, the embodiments are not limited to the NAND type flash memory, and are applicable to other semiconductor memories such as a Magnetic RAM (MRAM) or Resistive RAM (ReRAM).

Figure 30:
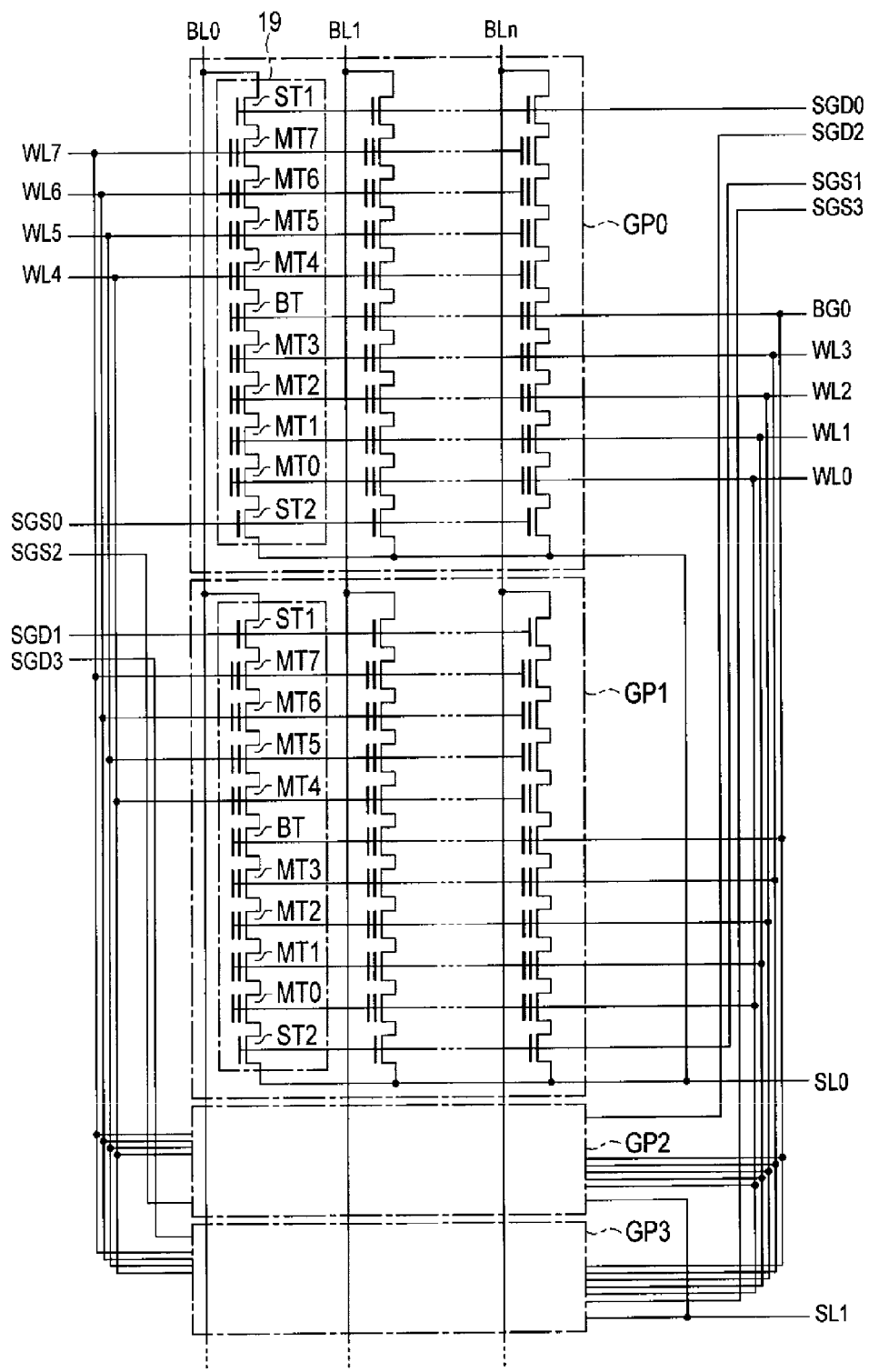
FIG. 30 is a circuit diagram of a memory cell array according to a modification of the first to seventh embodiments.

In addition, the memory cell array shown in FIG. 2 may have a configuration as shown in FIG. 30. FIG. 30 is a circuit diagram of the memory cell array 10. As shown in FIG. 30, word lines WL0 to WL3, a back gate line BG, even select gate lines SGD0 and SGD2, and odd select gate lines SGS1 and SGS3 are drawn out on one end side of the memory cell array 10. In contrast, word lines WL4 to WL7, even select gate lines SGS0 and SGS2, and odd select gate lines SGD1 and SGD3 are drawn out on the other side which is an opposite side to one end side of the memory cell array. This configuration may be used. In this configuration, for example, the row decoder 11 may be divided into two row decoders which are disposed so as to be opposite to each other with the memory cell array 10 therebetween. In addition, one row decoder may select the select gate lines SGD0, SGD2, SGS1 and SGS3, the word lines WL0 to WL3, and the back gate line BG, and the other row decoder may select the select gate lines SGS0, SGS2, SGD1 and SGD3, and the word lines WL4 to WL7. According to this configuration, it is possible to alleviate complexity of lines such as the select gate lines or the word lines of the region (including the row decoder 11) between the sense circuit 12 and the memory cell array 10.

Figure 31:
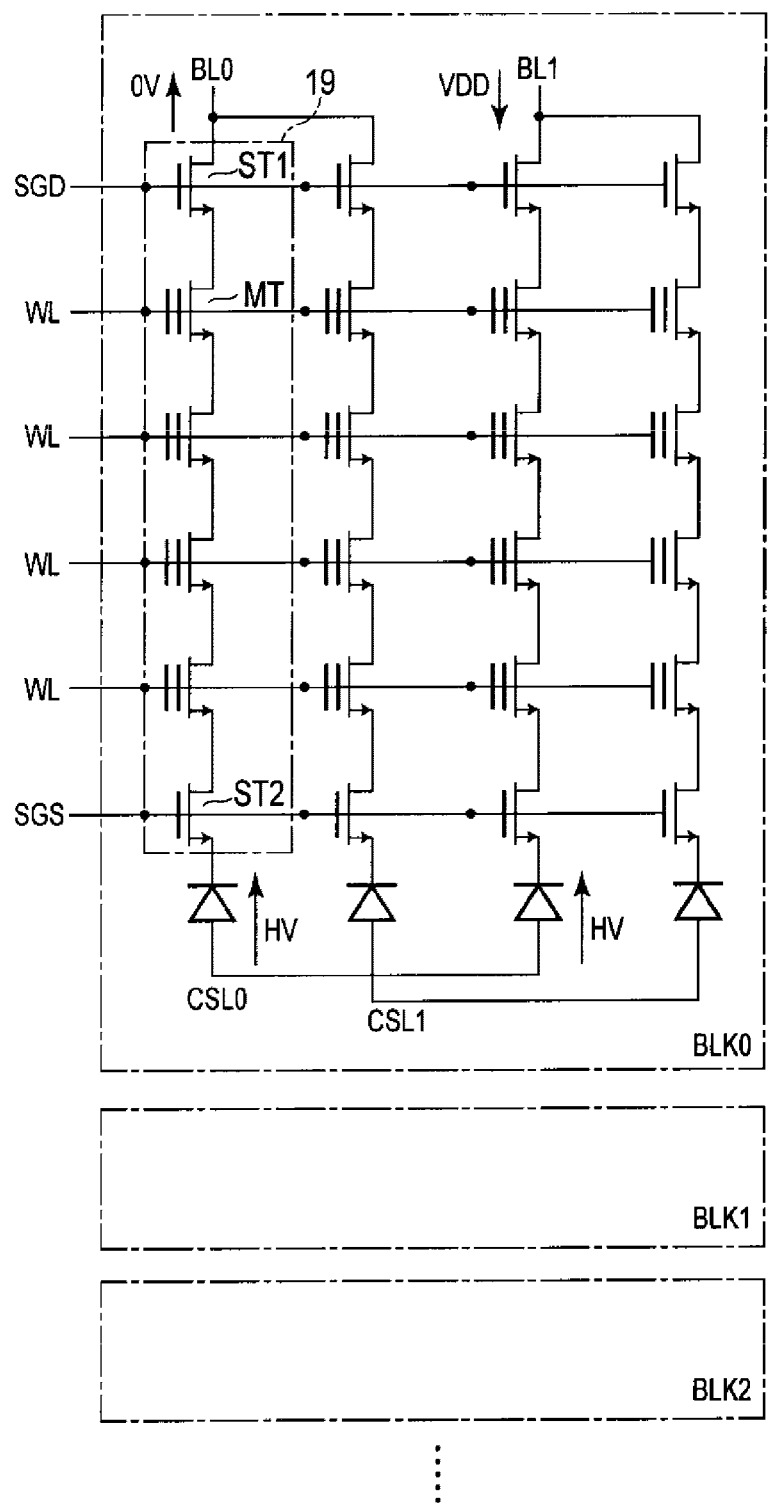
FIG. 31 is a circuit diagram of a memory cell array according to a modification of the first to seventh embodiments.

In addition, the memory cell array may have a configuration shown in FIG. 31. In the example shown in FIG. 31, each NAND string 19 includes, for example, four memory cell transistors MT, and selection transistors ST1 and ST2. In addition, a source of the selection transistor ST2 is connected to a line CSL via a diode, and a voltage HV is applied thereto by the diode such that the NAND string 19 can be arbitrarily selected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of memory cells;
    a plurality of bit lines, each of which is electrically connected to a string of the memory cells;
    a sense module provided for each of the bit lines, wherein each sense module includes a sense transistor that is configured to be turned on and off during a reading operation according to whether or not data is stored in a memory cell that is targeted by the reading operation, the sense transistor having a gate that is electrically connected to a sense node, the sense node being electrically connected to a first node to which a first signal is applied and to a second node, which is at a voltage level different from that of the first node, through a series of transistors including the sense transistor and first and second transistors, which when turned on, cause the sense node to be discharged to a voltage level that is equal to a first voltage level plus a threshold voltage level of the sense transistor; and
    a control circuit configured to turn on the first and second transistors and then, when the sense node has been discharged to the first voltage level plus the threshold voltage level of the sense transistor, to electrically connect the sense node to a corresponding bit line.

2. The semiconductor memory device according to claim 1, wherein the control circuit is configured to turn on the first transistor prior to the second transistor.

3. The semiconductor memory device according to claim 2, wherein the control circuit is configured to turn on the first transistor to electrically connect the sense node to a voltage source and cause the sense node to be charged up to a voltage level of the voltage source.

4. The semiconductor memory device according to claim 1, further comprising a third transistor electrically connected between a voltage source and the sense node, which when turned on, causes the sense node to be charged up to a voltage level of the voltage source.

5. The semiconductor memory device according to claim 1, further comprising a data latch configured to hold data sensed by the sense module.

6. The semiconductor memory device according to claim 5, wherein the second transistor and the sense transistor are electrically connected in series and to a data line electrically connecting the sense module and the data latch, to provide a discharge path for the data line.

7. A semiconductor memory device comprising:
a memory cell;
a bit line that is electrically connected to one end of the memory cell;
a sense module that is electrically connected to the bit line, the sense module including a first transistor, a second transistor, a third transistor, a fourth transistor and a sense node, one end of the first transistor being electrically connected to the bit line, the other end of the first transistor being electrically connected to the sense node, one end of the second transistor being electrically connected to the sense node, the other end of the second transistor being electrically connected to one end of the third transistor, the other end of the third transistor being electrically connected to one end of the fourth transistor and the sense node being electrically connected to a gate of the fourth transistor, the sense node being electrically connected to a first node to which a first signal is applied and the other end of the fourth transistor being electrically connected to a second node, which is at a voltage level different from that of the first node; and
a controller that is configured to perform a reading operation on a condition that:
a first voltage is applied to a gate of the second transistor during a first period and during a second period that is after the first period,
a second voltage is applied to the other end of the fourth transistor during the second period,
a third voltage is applied to a gate of the third transistor after the second voltage has been applied during the second period, and
a fourth voltage is applied to a gate of the first transistor during a third period after the second period.

8. The semiconductor memory device according to claim 7, further comprising:
a control circuit configured to turn on the second and third transistors and then, when the sense node has been discharged to a fifth voltage level plus a threshold voltage level of the first transistor, to electrically connect the sense node to the bit line.

9. The semiconductor memory device according to claim 8, further comprising a fifth transistor electrically connected between a voltage source and the sense node, which when turned on, causes the sense node to be charged up to a voltage level of the voltage source.

10. The semiconductor memory device according to claim 9, wherein the voltage level of the voltage source is proportional to the threshold voltage of the first transistor.

11. The semiconductor memory device according to claim 9, further comprising:
a data latch that is electrically connected to the second transistor and the third transistor.

12. The semiconductor memory device according to claim 11, further comprising a sixth transistor that electrically connects to one end of a capacitor and to the other end of the fourth transistor.

13. The semiconductor memory device according to claim 9, further comprising a capacitor electrically connected between the sense node and the first node, wherein the control signal controls the first signal applied to the first node to go to a high level prior to electrically connecting the sense node to the bit line.

14. A method of controlling a reading operation in a semiconductor memory device including a plurality of memory cells, a bit line that is electrically connected to one of the memory cells, a sense module that is electrically connected to the bit line, and a data latch configured to hold data sensed by the sense module and electrically connected to the sense module through a data line, said method comprising:
charging a sense node that is electrically connected to a gate of a sense transistor and a first node to which a first signal is applied, to a first voltage level;
discharging the sense node through a series of transistors that include the sense transistor and are between the sense node and a second node, which is at a voltage level different from that of the first node, to a second voltage level that is less than the first voltage level and equal to a third voltage level plus a threshold voltage of the sense transistor; and
electrically connecting the sense node to the bit line.

15. The method of claim 14, further comprising:
prior to electrically connecting the sense node to the bit line, controlling the first signal that is applied to the first node, which is electrically connected to the sense node through a capacitor, to go to a high level to increase the voltage level of the sense node.

16. The method of claim 15, further comprising:
charging the data line; and then
performing a strobe operation on the data line and storing a high or low voltage level in the data latch according to a change in a voltage level of the data line in response to the strobe operation.

17. The method of claim 16, wherein the data latch stores the low voltage level if the voltage level of the data line decreases in response to the strobe operation.

18. The method of claim 16, wherein the data latch stores the high voltage level if the voltage level of the data line is maintained in response to the strobe operation.

* * * * *